US011635810B2

(12) United States Patent
Oliver et al.

(10) Patent No.: US 11,635,810 B2
(45) Date of Patent: Apr. 25, 2023

(54) MANAGING AND MAPPING MULTI-SIDED TOUCH

(71) Applicant: QUALCOMM incorporated, San Diego, CA (US)

(72) Inventors: Robyn Teresa Oliver, Highland Park, IL (US); Robert Tartz, San Marcos, CA (US); Douglas Brems, San Diego, CA (US); Suhail Jalil, San Diego, CA (US); Jonathan Kies, Encinitas, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/408,843

(22) Filed: Aug. 23, 2021

(65) Prior Publication Data

US 2021/0382550 A1   Dec. 9, 2021

Related U.S. Application Data

(63) Continuation of application No. 16/003,487, filed on Jun. 8, 2018, now Pat. No. 11,126,258.
(Continued)

(51) Int. Cl.
*G06F 3/01*   (2006.01)
*G06F 3/0488*   (2022.01)
(Continued)

(52) U.S. Cl.
CPC ............ *G06F 3/013* (2013.01); *G06F 1/3231* (2013.01); *G06F 3/017* (2013.01);
(Continued)

(58) Field of Classification Search
CPC ........ G06F 3/013; G06F 1/3231; G06F 3/017; G06F 3/03547; G06F 3/041;
(Continued)

(56) References Cited

U.S. PATENT DOCUMENTS 8,358,226 B2    1/2013  Reynolds et al.
8,797,283 B2    8/2014  Waas
(Continued)

OTHER PUBLICATIONS

International Preliminary Report on Patentability—PCT/US2018/043017, The International Bureau of WIPO—Geneva, Switzerland, dated Apr. 23, 2020. 8 pages.
(Continued)

*Primary Examiner* — Bryan Earles
(74) *Attorney, Agent, or Firm* — The Marbury Law Group, PLLC

(57) ABSTRACT

Various embodiments include processing devices and methods for managing multisensor inputs on a mobile computing device. Various embodiments may include receiving multiple inputs from multiple touch sensors, identifying types of user interactions with the touch sensors from the multiple inputs, identifying sensor input data in a multisensor input data structure corresponding with the types of user interactions, and determining whether the multiple inputs combine as a multisensor input in an entry in the multisensor input data structure having the sensor input data related to a multisensor input response. Various embodiments may include detecting a trigger for a multisensor input mode, entering the multisensor input mode in response to detecting the trigger, and enabling processing of an input from a touch sensor.

18 Claims, 22 Drawing Sheets

Related U.S. Application Data

(60) Provisional application No. 62/572,471, filed on Oct. 14, 2017, provisional application No. 62/572,460, filed on Oct. 14, 2017, provisional application No. 62/572,455, filed on Oct. 14, 2017, provisional application No. 62/572,465, filed on Oct. 14, 2017, provisional application No. 62/572,453, filed on Oct. 14, 2017.

(51) Int. Cl.
| | |
|---|---|
| *G06F 3/041* | (2006.01) |
| *H03K 17/96* | (2006.01) |
| *G06F 3/048* | (2013.01) |
| *G06F 1/3231* | (2019.01) |
| *G06F 3/04883* | (2022.01) |
| *G06F 3/044* | (2006.01) |
| *G06F 3/0354* | (2013.01) |

(52) U.S. Cl.
CPC .......... *G06F 3/03547* (2013.01); *G06F 3/041* (2013.01); *G06F 3/044* (2013.01); *G06F 3/048* (2013.01); *G06F 3/0412* (2013.01); *G06F 3/0488* (2013.01); *G06F 3/04166* (2019.05); *G06F 3/04883* (2013.01); *H03K 17/9622* (2013.01); *G06F 2203/04104* (2013.01); *G06F 2203/04106* (2013.01)

(58) Field of Classification Search
CPC .... G06F 3/0412; G06F 3/04166; G06F 3/044; G06F 3/048; G06F 3/0488; G06F 3/04883; G06F 2203/04104; G06F 2203/04106; H03K 17/9622; Y02D 10/00
See application file for complete search history.

(56) References Cited

U.S. PATENT DOCUMENTS

| | | | |
|---|---|---|---|
| 8,854,320 B2 | 10/2014 | Hirata et al. | |
| 8,988,356 B2 | 3/2015 | Tseng | |
| 9,152,271 B2 | 10/2015 | Schmidt et al. | |
| 9,389,830 B2 | 7/2016 | Yuan | |
| 9,519,356 B2 | 12/2016 | Hinckley et al. | |
| 9,557,846 B2 | 1/2017 | Baharav et al. | |
| 9,588,629 B2 | 3/2017 | Jordan et al. | |
| 9,772,764 B2 | 9/2017 | Elyada et al. | |
| 10,067,664 B2 | 9/2018 | Kim | |
| 10,306,174 B1 | 5/2019 | Grafton et al. | |
| 10,551,984 B2 | 2/2020 | Kies et al. | |
| 10,901,606 B2 | 1/2021 | Kies et al. | |
| 11,126,258 B2 | 9/2021 | Oliver et al. | |
| 2006/0197750 A1 | 9/2006 | Kerr et al. | |
| 2011/0053641 A1 | 3/2011 | Lee et al. | |
| 2011/0074716 A1 | 3/2011 | Ono | |
| 2011/0087963 A1 | 4/2011 | Brisebois et al. | |
| 2011/0163986 A1 | 7/2011 | Lee et al. | |
| 2012/0120004 A1* | 5/2012 | Chang | G06F 3/041 345/173 |
| 2012/0127089 A1* | 5/2012 | Waas | G06F 3/017 345/173 |
| 2012/0139860 A1 | 6/2012 | Hotelling et al. | |
| 2012/0268411 A1 | 10/2012 | Chen et al. | |
| 2012/0271545 A1 | 10/2012 | Cheng | |
| 2013/0106710 A1 | 5/2013 | Ashbrook | |
| 2013/0162667 A1 | 6/2013 | Eskolin et al. | |
| 2013/0194235 A1 | 8/2013 | Zanone et al. | |
| 2013/0257746 A1 | 10/2013 | Cherkasov et al. | |
| 2013/0265276 A1 | 10/2013 | Obeidat et al. | |
| 2014/0009415 A1 | 1/2014 | Nishida | |
| 2014/0078086 A1 | 3/2014 | Bledsoe et al. | |
| 2014/0218309 A1* | 8/2014 | Park | G06F 3/03547 345/173 |
| 2015/0015512 A1 | 1/2015 | Kwak et al. | |
| 2015/0042588 A1 | 2/2015 | Park et al. | |
| 2015/0128078 A1 | 5/2015 | Oh et al. | |
| 2015/0177945 A1 | 6/2015 | Sengupta et al. | |
| 2015/0212647 A1 | 7/2015 | Kim et al. | |
| 2015/0227166 A1 | 8/2015 | Lee et al. | |
| 2015/0363035 A1 | 12/2015 | Hinckley et al. | |
| 2015/0363082 A1 | 12/2015 | Zhao et al. | |
| 2016/0004384 A1 | 1/2016 | Sato | |
| 2016/0026309 A1 | 1/2016 | Wu et al. | |
| 2016/0077627 A1* | 3/2016 | Vecera | G06F 3/04883 345/174 |
| 2016/0212710 A1 | 7/2016 | Ting et al. | |
| 2016/0239148 A1 | 8/2016 | Lee et al. | |
| 2016/0282988 A1 | 9/2016 | Poupyrev | |
| 2016/0291731 A1 | 10/2016 | Liu et al. | |
| 2017/0046125 A1 | 2/2017 | Gargi et al. | |
| 2017/0115782 A1 | 4/2017 | Hinckley et al. | |
| 2018/0067638 A1 | 3/2018 | Klein et al. | |
| 2019/0113995 A1 | 4/2019 | Kies et al. | |
| 2019/0114005 A1 | 4/2019 | Kies et al. | |
| 2019/0114021 A1 | 4/2019 | Oliver et al. | |
| 2021/0109611 A1 | 4/2021 | Kies et al. | |
| 2021/0278896 A1 | 9/2021 | Oliver | |
| 2021/0278897 A1 | 9/2021 | Oliver | |

OTHER PUBLICATIONS

International Preliminary Report on Patentability—PCT/US2018/046648, The International Bureau of WIPO—Geneva, Switzerland, dated Apr. 23, 2020. 9 pages.
International Search Report and Written Opinion—PCT/US2018/043017—ISA/EPO—dated Jan. 2, 2019. 21 pages.
International Search Report and Written Opinion—PCT/US2018/046656—ISA/EPO—dated Nov. 9, 2018. 13 pages.
International Search Report and Written Opinion—PCT/US2018/046648—ISA/EPO—dated Nov. 9, 2018. 14 pages.
Partial International Search Report—PCT/US2018/043017—ISA/EPO—dated Oct. 31, 2018. 16 pages.

* cited by examiner

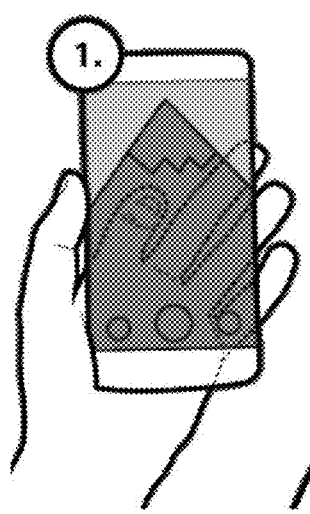 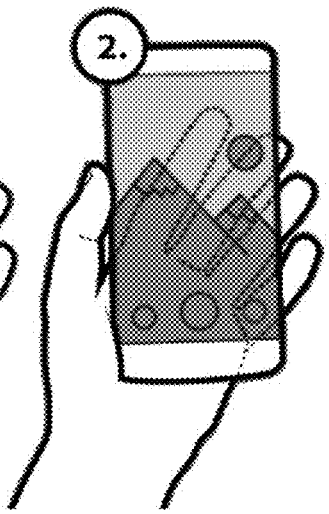
FIG. 21A    FIG. 21B
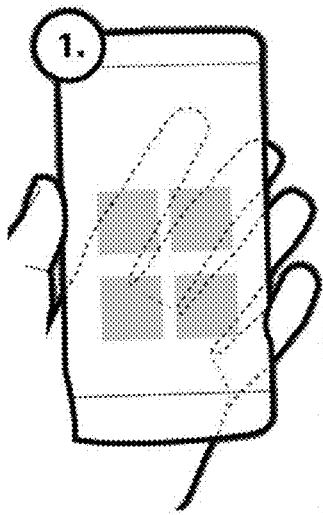 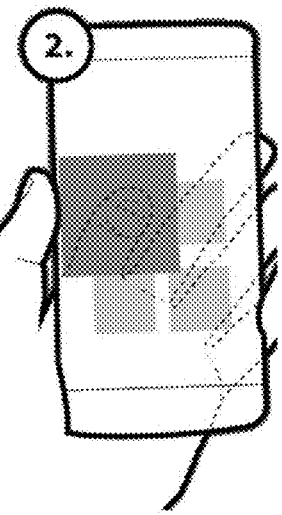
FIG. 22A    FIG. 22B
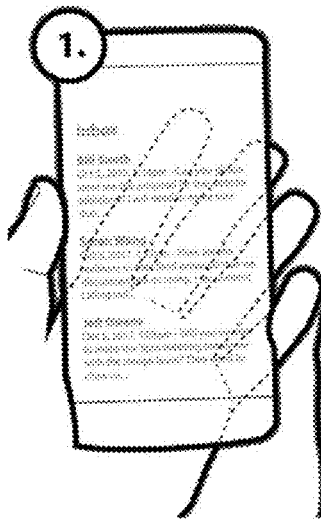 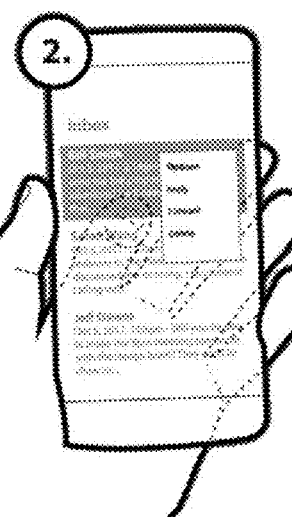
FIG. 23A    FIG. 23B

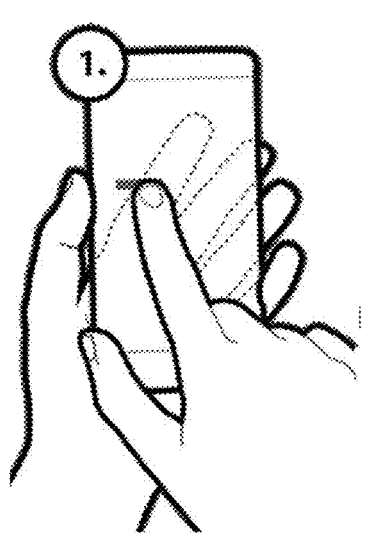 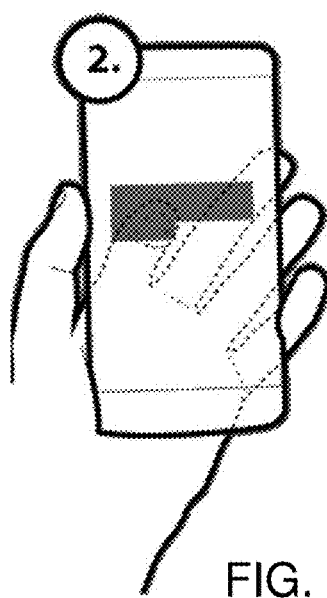
FIG. 28A  FIG. 28B
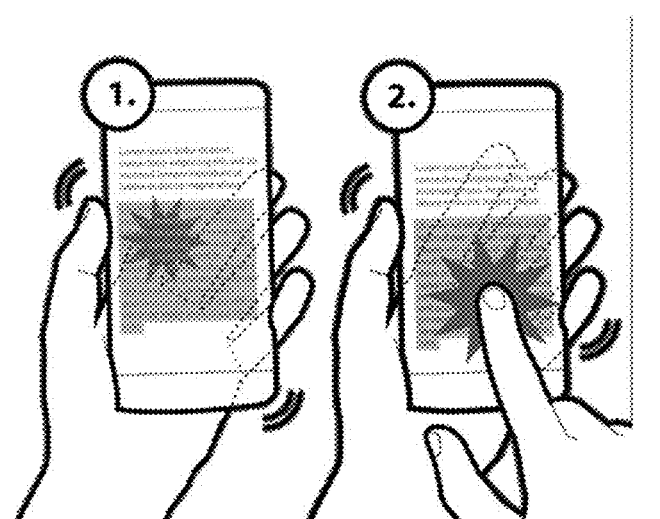
FIG. 29A  FIG. 29B
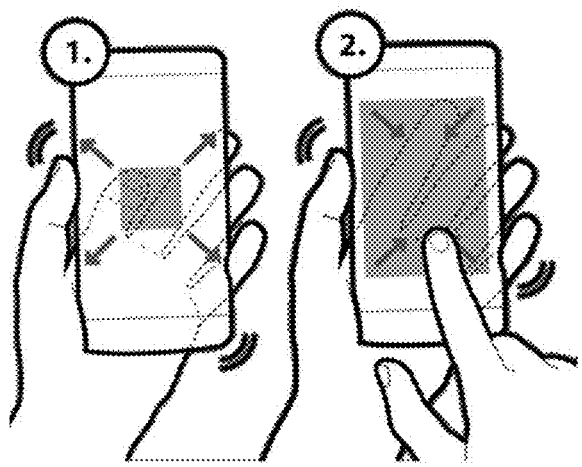
FIG. 30A  FIG. 30B

MANAGING AND MAPPING MULTI-SIDED TOUCH

RELATED APPLICATIONS

This application is a continuation of U.S. patent application Ser. No. 16/003,487 entitled "Managing and Mapping Multi-Sided Touch" filed Jun. 8, 2018, which claims the benefit of priority to U.S. Provisional Patent Application Ser. No. 62/572,453 entitled "Managing And Mapping Multi-Sided Touch" filed on Oct. 14, 2017, to U.S. Provisional Patent Application Ser. No. 62/572,465 entitled "Methods For Integrating Multi-Touch Across Rear/Side Surfaces And A Front Display" filed on Oct. 14, 2017, to U.S. Provisional Patent Application Ser. 62/572,455 entitled "Methods of Direct Manipulation of Multi-Layered User Interfaces" filed on Oct. 14, 2017, to U.S. Provisional Patent Application Ser. 62/572,460 entitled "Methods For Detecting Device Context In Order To Alter Touch Capacitance" filed on Oct. 14, 2017, and to U.S. Provisional Patent Application Ser. No. 62/572,471 entitled "Method And Apparatus To Accommodate Both Wireless Charging And Back Touch Sensing" filed on Oct. 14, 2017. The contents of all of these documents are incorporated herein by reference.

BACKGROUND

Mobile computing devices may use a wide variety of input methods. In addition to buttons and other physical input devices, mobile computing devices typically include an electronic display capable of detecting the presence and location of the touch within the display area (i.e., a "touchscreen"). Numerous software applications for mobile computing devices make use of touchscreen inputs, and thus touchscreens have dramatically expanded the type and range of possible user interactions with mobile computing devices.

However, touchscreen interactions require the user's focused attention to see a target to touch (e.g., an icon, text, etc.) or a response to the input. Further, more complex software applications or features may be difficult or cumbersome to control through interactions with a touchscreen. Moreover, many interactions with mobile computing devices have limited access to the touchscreen or require one hand to hold the mobile computing device so that fingers of the other hand may interact with the touchscreen.

SUMMARY

Various embodiments may include enabling processing of a first input from a first touch sensor, detecting a trigger for a multisensor input mode, entering the multisensor input mode in response to detecting the trigger, and enabling processing of a second input from a second touch sensor.

In some embodiments, detecting a trigger for a multisensor input mode may include detecting a device parameter that is not an input from the second touch sensor.

In some embodiments, detecting a trigger for a multisensor input mode may include detecting a third input from the second touch sensor.

In some embodiments, detecting a trigger for a multisensor input mode may include executing an instruction of an application configured to trigger entering the multisensor input mode.

Some embodiments may further include determining a multisensor input data structure associated with the trigger, and loading the multisensor input data structure.

Some embodiments may further include receiving the second input from the second touch sensor, identifying a first type of user interaction with the second touch sensor from the second input, identifying a first sensor input data in the multisensor input data structure corresponding with the first type of user interaction, identifying a multisensor input in an entry in the multisensor input data structure having the first sensor input data related to a multisensor input response.

In some embodiments, identifying a multisensor input in an entry in the multisensor input data structure having the first sensor input data related to a multisensor input response may include identifying the multisensor input in the entry in the multisensor input data structure having the first sensor input data and a device parameter data related to the multisensor input response.

In some embodiments, identifying a multisensor input in an entry in the multisensor input data structure having the first sensor input data related to a multisensor input response may include identifying the multisensor input in the entry in the multisensor input data structure having the first sensor input data and an application data related to the multisensor input response.

Various embodiments may further include a mobile computing device having a plurality of touch sensors, that may include a first touch sensor and a second touch sensor, and a processor configured to perform operations of any of the methods summarized above. Various embodiments may include a mobile computing device having means for performing functions of any of the methods summarized above. Various embodiments may include a non-transitory processor-readable storage medium on which are stored processor-executable instructions configured to cause a processor of a computing device to perform operations of any of the methods summarized above

BRIEF DESCRIPTION OF THE DRAWINGS

The accompanying drawings, which are incorporated herein and constitute part of this specification, illustrate exemplary embodiments of the invention, and together with the general description given and the detailed description, serve to explain the features herein.

FIGS. 21A and 21B are plan views of a user holding a mobile computing device one-handed while tapping a back panel to active a function of an active application.

FIGS. 22A and 22B are plan views of a user performing a tap gesture on a back of a mobile computing device to active a function of another active application.

FIGS. 23A and 23B are plan views of a user performing a tap gesture on a back of a mobile computing device to active yet another function of another active application.

FIGS. 28A and 28B are plan views of a user performing a combination of gestures, one on the back panel and another on the touchscreen of the mobile computing device to perform certain functions, like text selection for copy/past or precision cursor adjustment.

FIGS. 29A and 29B are plan views of a user performing another combination of gestures, one on the back panel and another on the touchscreen of the mobile computing device to perform certain functions.

FIGS. 30A and 30B are plan views of a user performing another combination of gestures, one on the back panel and another on the touchscreen of the mobile computing device to perform certain functions.

DETAILED DESCRIPTION

Figure 1A:
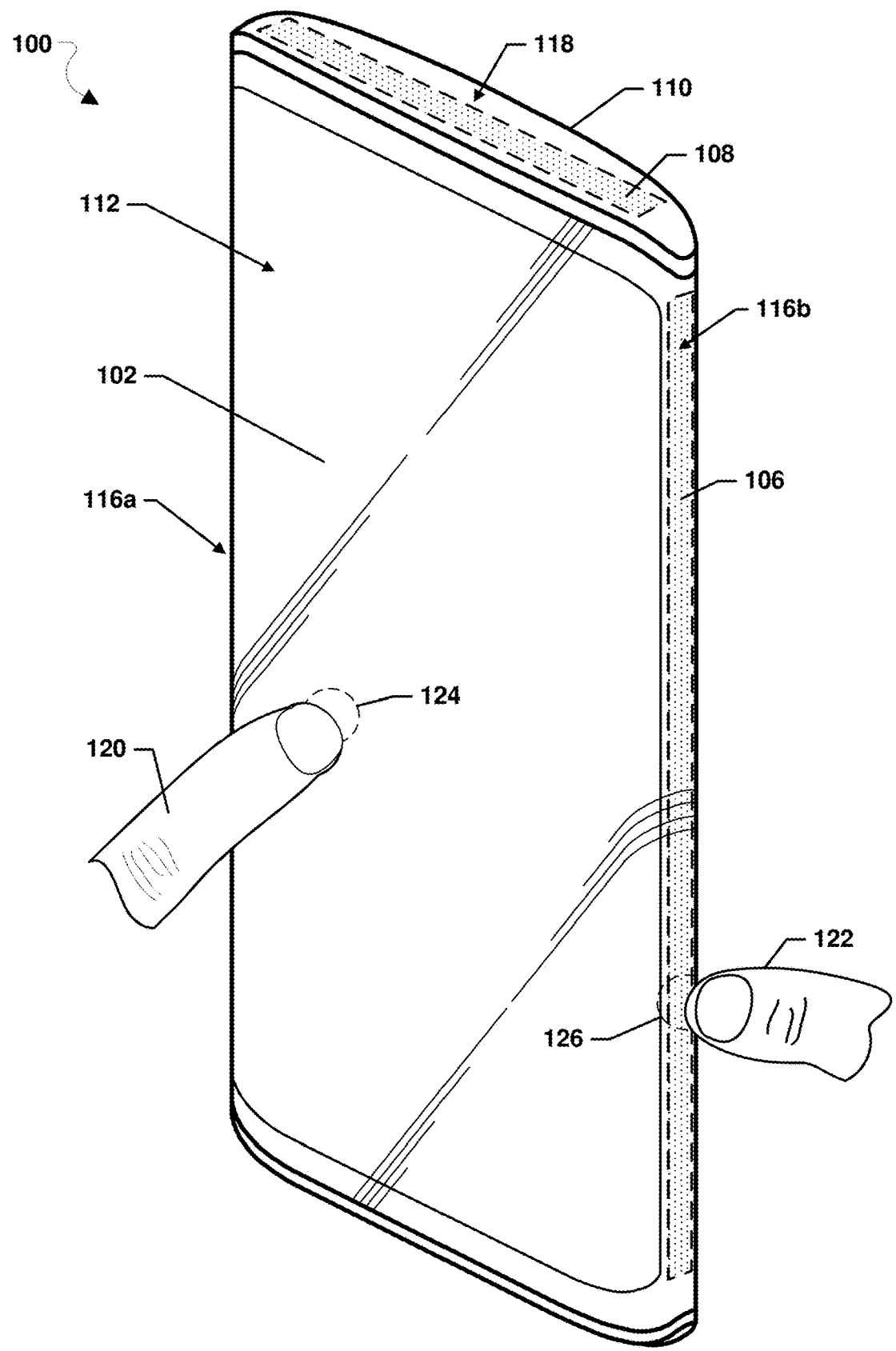
FIG. 1A is a perspective view diagram of user interactions with a mobile computing device having touch sensors.

The various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the invention or the claims.

The term "mobile computing device" is used herein to refer to any one or all of variety of small computing devices, particularly computing devices including touch sensors (e.g., capacitive sensors, pressure touch sensors, touchscreen displays, and other suitable sensors configured detect and localize a user touch on a surface of the device), a programmable processor and memory and circuitry for receiving user inputs. Examples of computing devices for which the various embodiments are particularly useful include smartphones, tablet computing devices configured to be held on the edges by a user, wearable computing devices, other similar computing platforms, and other similar devices.

The term "multisensor input" is used herein to refer to information received from at least one touch sensor on the mobile computing device distinct from a touchscreen of the mobile computing device. The multisensor input may reflect characteristics of various types of input detected by the at least one touch sensor including a duration of contact, a number of contact points, a size of the contact point(s), a sequence or contiguous series of contacts, a pattern of simultaneous contacts, and/or a level of pressure or force applied during the contact.

The term "operational context" is used herein to refer to the external environment that influences operation of an application on a mobile computing device. The hardware and software environment of the mobile computing device defines the operational context.

The term "data" is used herein to refer interchangeably to a singular datum and/or to a plurality of data. Examples of such use of the term "data" include, but are not limited to, the terms "data", "sensor input data", "device parameter data", "location data", "global positioning system (GPS) data", "wireless connection data", "peripheral device connection data", "mobile computing device state data", "application data", "action data", "contextual awareness data", and "sensor data".

Mobile computing devices are often configured with a touchscreen that serves as a display for one or more active applications, while also providing users an interactive input surface. Touchscreen technology enables users to accomplish many tasks on his or her mobile computing device, such as a smartphone, with ease and convenience by interacting with applications by touching the display on the touchscreen. Consumer demands for increased usefulness of mobile computing devices seems to compete with the small size of these devices and user desires to easily operate the devices with just a few fingers or even using only one hand. Touchscreen interactions require a user's focused attention to see a target to touch (e.g., an icon, text, etc.) or a response to the input. Further, more complex software applications may be difficult or cumbersome to control through interactions with a touchscreen. Moreover, many interactions with mobile computing devices require one hand to hold the mobile computing device so that fingers of the other hand may interact with the touchscreen. To address these issues, various embodiments provide additional touch sensors on the mobile computing device distinct from the touchscreen thereof.

Various embodiments include mobile computing devices having touch sensitive input sensors on multiple surfaces, such as rear or back, side(s), top, and bottom surfaces, and methods for interpreting touches on such surfaces to provide additional user input functionality.

Various embodiments enable a wide range of functionality and operational control of a mobile computing device that includes a plurality of touch sensitive input sensors on surfaces in addition to a touchscreen display, such as touch sensors positioned on the back area, the sides, the top edge, and the bottom edge of the device. By correlating detected touches and or gestures on two or more of the mobile computing device touch sensitive input sensors as well as an executing application and/or an operating state or condition of the device, various embodiments enable greater functionality and a broader range of user input controls that may be implemented with various applications.

Various embodiments may be implemented using a rules-based system that coordinates how inputs received from one or more touch sensors on the mobile computing device, distinct from or in addition to a touchscreen thereof, control and/or interact with applications running on the mobile computing device. For example, the received inputs from one or more touch sensors may be mapped to and interact with applications active with elements thereof displayed on the touchscreen. For example, received inputs from touch sensors disposed on the back and/or sides of the mobile computing device may control how content in the display on the touchscreen is represented and/or manipulated. In addition or alternatively, the received inputs from one or more touch sensors may control a background application distinct from an active application that dominates and/or controls the display on the touchscreen.

In various embodiments, a processor of the mobile computing device may disambiguate a user's intentions when a plurality of touch sensor readings are received as input. For example, when a user grips the mobile communication device with one or two hands and/or additionally contacts separate portions of the mobile communication device with one or more fingers, the processor may determine the grip contact may be ignored, but the finger contact may be acted upon.

In various embodiments, a processor of a mobile computing device including a plurality of touch sensors may monitor touch sensor measurements and generate a touch profile based thereon. As an example, the processor of the mobile computing device may generate a touch profile based on input from one or more touch sensors, other than or in addition to the touchscreen. The generated touch profile may reflect characteristics of various types of inputs including a duration of contact, a number of contact points, a size of the contact point(s), a sequence or contiguous series of contacts, a pattern of simultaneous contacts, and a level of pressure or force applied during the contact. In addition, the generated touch profile may reflect which received inputs may be ignored (e.g., normal grip patterns) and/or which may be acted upon (e.g., intentional touches). The processor may also use contextual awareness data in order to determine an operational context of the mobile computing device, which may dictate how or what to do with the generated touch profile. The contextual awareness data may reflect the settings/parameters from and state information of active applications and/or resources of the mobile computing device. In this way, the operational context of the mobile computing device may be used to determine what operations to perform based on the generated touch profile.

The computing devices and methods of various embodiments address a problem of deciphering intentions of a user of a mobile computing device in response to activation of multiple touch sensors of the mobile computing device. The various embodiments enable mobile computing devices configured with multiple touch sensors to distinguish between true and false inputs to the multiple touch sensors by processing signals from the multiple touch sensors.

Figure 1B:
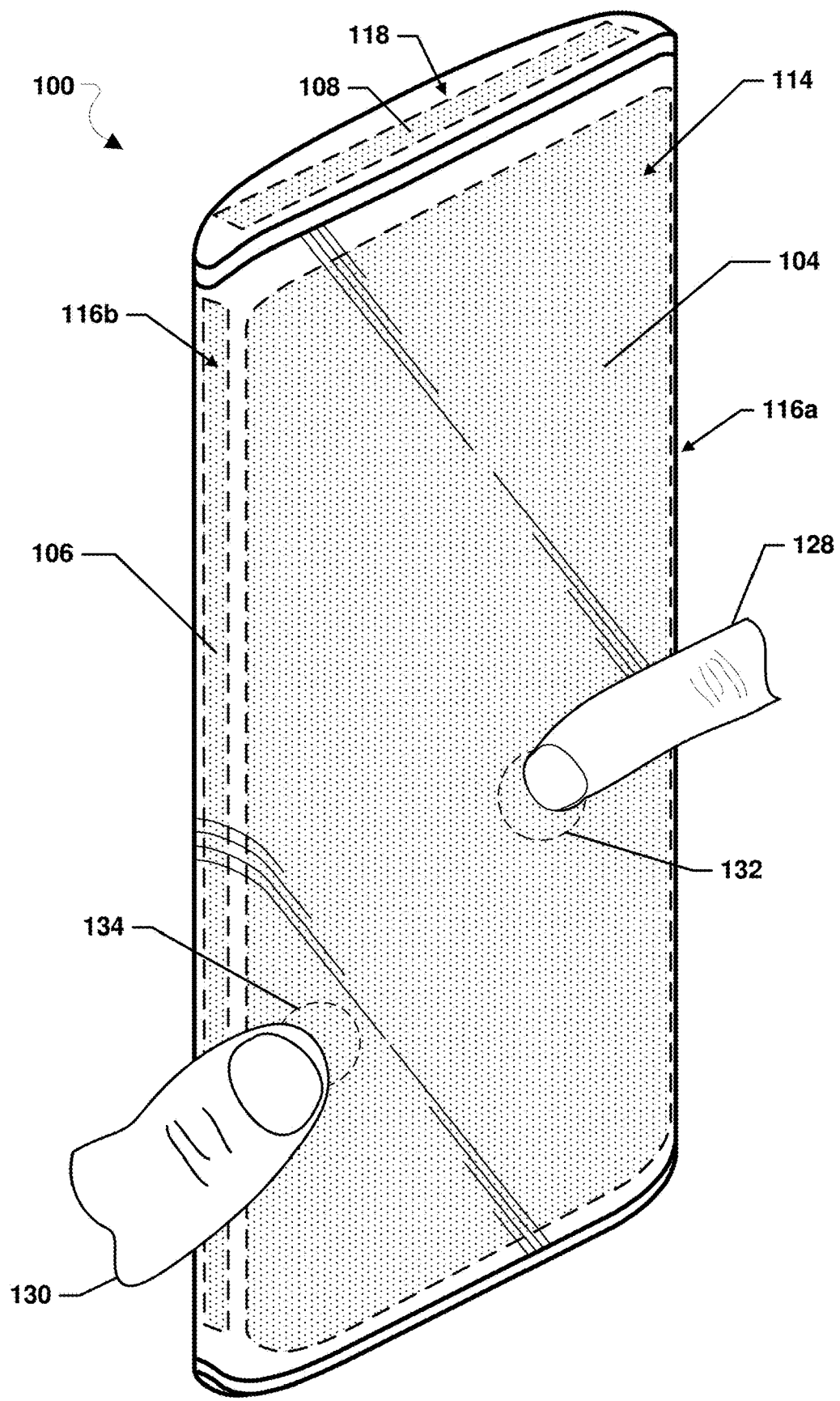
FIG. 1B is a perspective view diagram of user interactions with a mobile computing device having touch sensors.

Various embodiments may be implemented within a variety of mobile computing devices, an example of which is illustrated in FIGS. 1A and 1B. With reference to FIGS. 1A and 1B, a mobile computing device 100 may include a body 110 having a front area 112, a rear area 114, two sides 116a, 116b between the front area 112 and the rear area 114, and a top area 118 between the front area 112 and the rear area 114. The front area 112 may include a touch sensor 102 that may be incorporated within a display in the form of a touchscreen display. The rear area 114 may include a touch sensor 104. One or both of the sides 116a, 116b may include a touch sensor 106. The top area 118 may include a touch sensor 108. Thus, the body 110 of the mobile computing device 100 may include one or more touch sensors on the front area 112, the rear area 114, the one or more sides 116a, 116b, and the top area 118. The touch sensors 102, 104, 106, 108 may be configured to receive an input 124, 132 from a user's finger 120, 128 and/or an input 126, 134 from a user's thumb 122, 130.

A touch sensor 102, 104, 106, 108 is configured to detect a change in touch sensor state, such as a measurement of capacitance or pressure, at a location where the sensor is touched (or nearly touched) by an object, particularly by a user's hand, thumb, or fingers. While finger and thumb touch inputs 124, 126, 132, 134 on the touch sensors 102, 104, 106, 108 are illustrated in FIGS. 1A and 1B, the touch sensors 102, 104, 106, 108 may detect a change in touch sensor state from any contact with a user's body, such as contact with a user's palm or face, touches by a stylus or another similar input device, and the like. In some embodiments, a touch sensor 102, 104, 106, 108 may detect two or more contact locations (e.g., a multi-touch sensor). In some embodiments, a touch sensor 102, 104, 106, 108 may detect a pressure of one or more contacts. Outputs from the various touch sensors 102, 104, 106, 108 may be provided to a processor (e.g., a processor that is included within or coupled to the touch sensors 102, 104, 106, 108) that is configured to determine locations of touches that may be treated as user inputs to the mobile computing device 100.

In some embodiments, a processor of the mobile computing device 100 and/or of the touch sensors 102, 104, 106, 108 may determine that one or more contacts have a duration that is less than, equal to, or greater than a threshold period of time. In some embodiments, such a processor may determine characteristics of the contact or contacts on one or more of the touch sensors 102, 104, 106, 108. For example, the contact characteristics may include a duration of contact, a number of contact points, a size of the contact point(s), a sequence or contiguous series of contacts, a pattern of simultaneous contacts, and a level of pressure or force applied during the contact(s). Contact associated with a user gripping the mobile communication device may be determined from various inputs, including a combination of concurrent contacts at multiple locations of the touch sensors 102, 104, 106, 108, which may be persistent for at least a minimum duration. In some embodiments, the processor of the mobile computing device may distinguish between a tap, a double tap, a long press, a sweep or flick, a drag, a predefined gesture including a plurality of touch and/or pressure inputs, a grip, other contacts, or any combination thereof. A predefined gesture may be a set or sequence of one or more contacts with the touch sensors 102, 104, 106, 108. The predefined gesture may be configured by a user, established by an application on the mobile computing device, or may be provided as a factory-installed default. In some embodiments, the touch sensors 102, 104, 106, 108 may be configured to detect a proximity or near-contact (e.g., a "hover") by a user's finger or thumb prior to or without physical contact.

While touch sensors 102, 104, 106, 108 are discussed herein generally in terms of touch sensors that detect touches based on changes in capacitance, such sensors are used merely as an example of one type of input sensor suitable for use with the various embodiments. Other types of input sensors, such as resistive-sensing input sensors, infrared sensing input sensors, resistive force sensors, etc., may be used in various embodiments.

Figure 2:
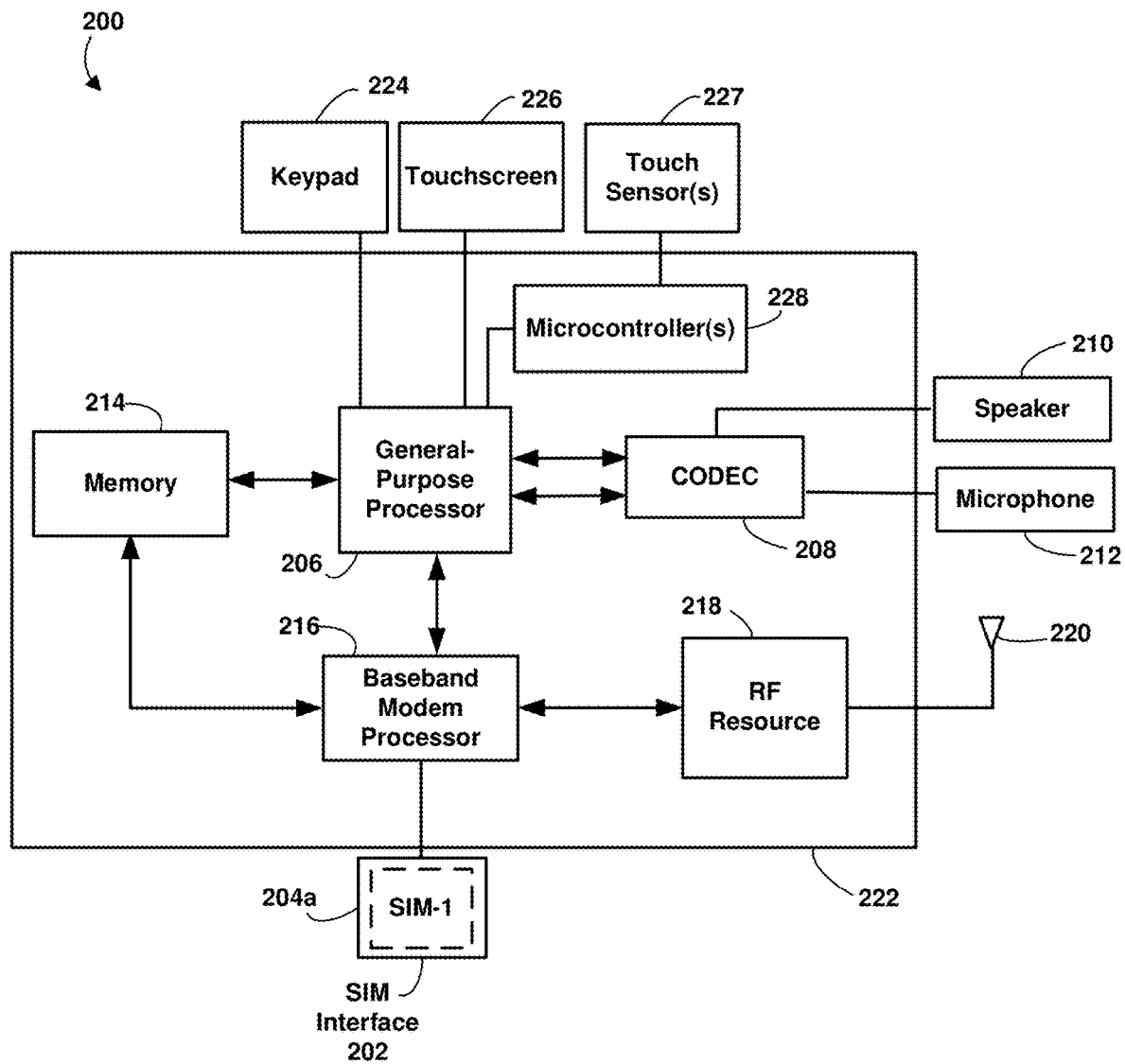
FIG. 2 is a component block diagram of a mobile communication device suitable for implementing various embodiments.

FIG. 2 is a functional block diagram of an example mobile computing device 200 that is suitable for implementing various embodiments. With reference to FIGS. 1A-2, the mobile computing device 200 may be similar to the mobile computing device 100. For example, the mobile computing device 200 may be a multi-SIM computing device, such as a multiple SIM multiple standby (MSMS) computing device. The mobile computing device 200 may include at least one subscriber identity module (SIM) interface 202, which may receive a first SIM ("SIM-1") 204a that is associated with a first subscription. In some embodiments, the at least one SIM interface 202 may be implemented as multiple SIM interfaces 202, which may receive at least a second that is associated with at least a second subscription.

A SIM in various embodiments may be a Universal Integrated Circuit Card (UICC) that is configured with SIM and/or universal SIM (USIM) applications, enabling access to a variety of different networks. The UICC may also provide storage for a phone book and other applications. Alternatively, in a code division multiple access (CDMA) network, a SIM may be a UICC removable user identity module (R-UIM) or a CDMA subscriber identity module (CSIM) on a card.

Each SIM 204a may have a CPU, ROM, RAM, EEPROM and I/O circuits. One or more of the first SIM 204a and any additional SIMs used in various embodiments may contain user account information, an international mobile station identifier (IMSI), a set of SIM application toolkit (SAT) commands and storage space for phone book contacts. One or more of the first SIM 204a and any additional SIMs may further store home identifiers (e.g., a System Identification Number (SID)/Network Identification Number (NID) pair, a Home PLMN (HPLMN) code, etc.) to indicate the SIM network operator provider. An Integrated Circuit Card Identity (ICCID) SIM serial number may be printed on one or more SIM 204a for identification. In some embodiments, additional SIMs may be provided for use on the mobile computing device 200 through a virtual SIM (VSIM) application (not shown). For example, the VSIM application may implement remote SIMs on the mobile computing device 200 by provisioning corresponding SIM profiles.

The mobile computing device 200 may include at least one controller, such as a general-purpose processor 206, which may be coupled to a coder/decoder (CODEC) 208. The CODEC 208 may in turn be coupled to a speaker 210 and a microphone 212. The general-purpose processor 206 may also be coupled to at least one memory 214. The memory 214 may be a non-transitory tangible computer readable storage medium that stores processor-executable instructions. For example, the instructions may include routing communication data relating to a subscription though the transmit chain and receive chain of a corresponding baseband-RF resource chain. The memory 214 may store operating system (OS), as well as user application software and executable instructions. The general-purpose processor 206 and memory 214 may each be coupled to at least one baseband modem processor 216. Each SIM 204a in the mobile computing device 200 may be associated with a baseband-RF resource chain that includes at least one baseband modem processor 216 and at least one radio frequency (RF) resource 218.

The RF resource 218 may include receiver and transmitter circuitry coupled to at least one antenna 220, and configured to perform transmit/receive functions for the wireless services associated with each SIM 204a of the mobile computing device 200. The RF resource 218 may implement separate transmit and receive functionalities, or may include a transceiver that combines transmitter and receiver functions. The RF resource 218 may be configured to support multiple radio access technologies/wireless networks that operate according to different wireless communication protocols. The RF resource 218 may include or provide connections to different sets of amplifiers, digital to analog converters, analog to digital converters, filters, voltage controlled oscillators, etc. Multiple antennas 220 and/or receive blocks may be coupled to the RF resource 218 to facilitate multimode communication with various combinations of antenna and receiver/transmitter frequencies and protocols (e.g., LTE, WiFi, Bluetooth and/or the like).

The baseband modem processor 216 of a mobile computing device 200 may be configured to execute software including at least one modem stack associated with at least one SIM. SIMs and associated modem stacks may be configured to support a variety of communication services that fulfill different user requirements. Further, a particular SIM may be provisioned with information to execute different signaling procedures for accessing a domain of the core network associated with these services and for handling data thereof.

In some embodiments, the general-purpose processor 206, memory 214, baseband modem processor 216, and RF resource 218 may be included in a system-on-chip device 222. The SIMs 204a and their corresponding interface(s) 202 may be external to the system-on-chip device 222. Further, various input and output devices may be coupled to components of the system-on-chip device 222, such as interfaces or controllers. Example user input components suitable for use in the mobile computing device 200 may include, but are not limited to, a keypad 224, a touchscreen 226, such as a beveled edge touchscreen, and one or more touch sensors 227. The one or more touch sensors 227 may be similar to the touch sensors 102, 104, 106, 108 described with reference to FIGS. 1A and 1B.

In various embodiments, the one or more touch sensors 227 may be connected to one or more microcontrollers 228, and the microcontroller(s) 228 may be connected to the general-purpose processor 206. In various embodiments, the microcontroller(s) 228 may be configured with microcontroller-executable instructions to perform operations to determine whether a contact is occurring on the one or more touch sensors 227. In various embodiments, the microcontroller(s) 228 may be configured with microcontroller-executable instructions to perform operations to determine the location of the contact. In various embodiments, the microcontroller(s) 228 may be configured with microcontroller-executable instructions to perform operations to send an indication of the contact including contact parameter information to the general-purpose processor 206. In various embodiments, the general-purpose processor 206 may receive an indication of a contact from the microcontroller(s) 228.

Figure 3:
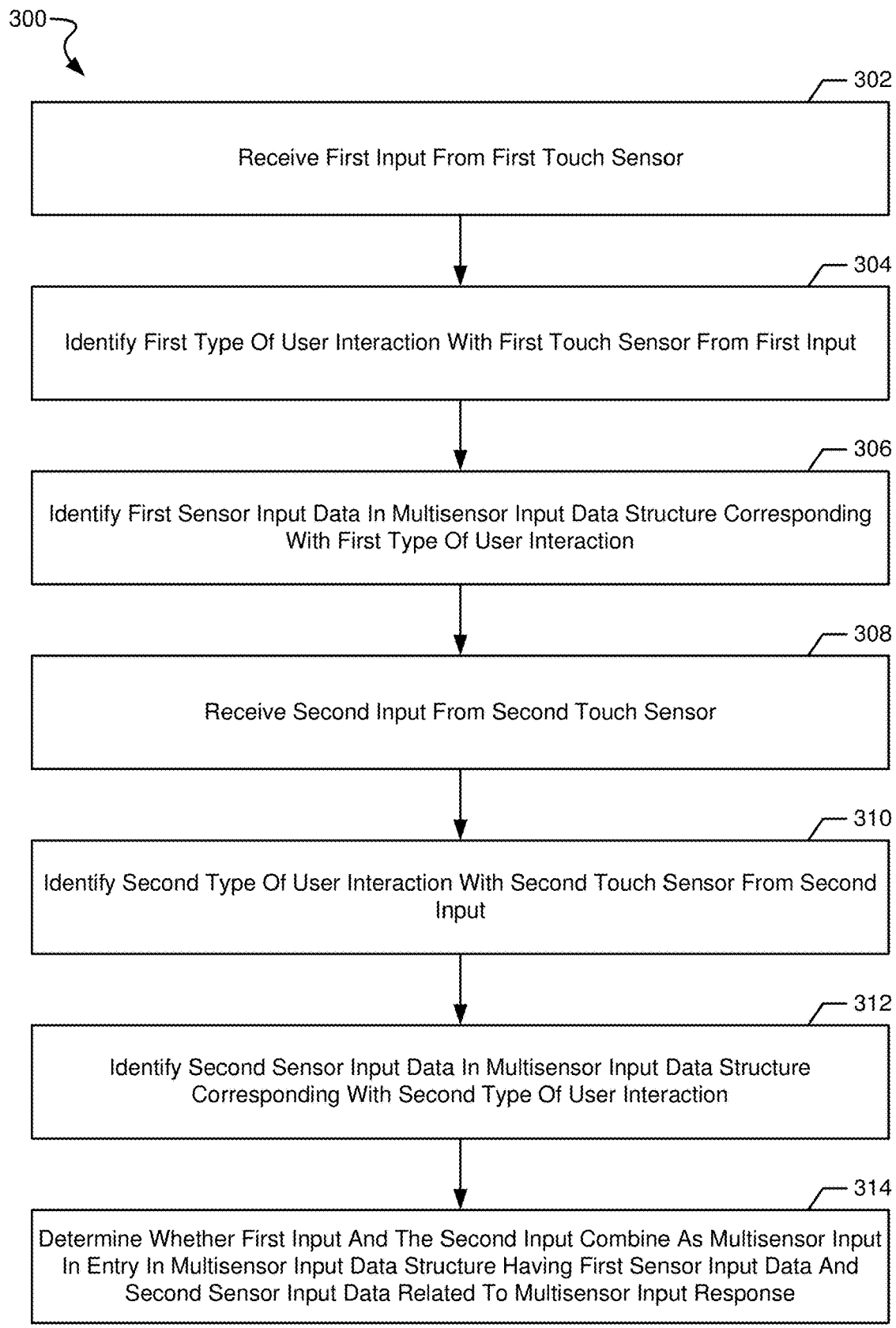
FIG. 3 is a process flow diagram illustrating a method of managing multisensor inputs according to various embodiments.

FIG. 3 illustrates a method of managing multisensor inputs according to various embodiments. With reference to FIGS. 1A-3, the method 300 may be implemented in hardware components and/or software components of the mobile computing device (e.g., 100, 200 in FIGS. 1A-2), the operation of which may be controlled by one or more processors (e.g., the general-purpose processor 206) of the mobile computing device. In order to encompass the alternative configurations enabled in various embodiments, the hardware implementing the method 300 is referred to herein as a "processing device."

In block 302, the processing device may receive a first input from a first touch sensor (e.g., touch sensor 102, 104, 106, 108, 227 in FIGS. 1A-2). In some embodiments, a user may interact with a surface or area (e.g., front area 112, rear area 114, sides 116a, 116b, and top area 118 in FIGS. 1A and 1B) of the mobile computing device having the first touch sensor. The user interaction with the first touch sensor may trigger a response by the processing device or a microcontroller (e.g., microcontroller 228 in FIG. 2) associated with the first touch sensor. The response may include signals or data configured to indicate qualities of the user interactions with the first touch sensor, such as location, area, duration, direction, speed, pressure, number, frequency, or sequence of interactions with the touch sensor. In some embodiments, the processing device may be configured to derive some such qualities of the user interactions with the first touch sensor from other qualities of the user interactions with the first touch sensor, as described further herein with reference to the method 800 in FIG. 8. The processing device may receive the signals or data configured to indicate qualities of the user interactions with the first touch sensor.

In block 304, the processing device may identify a first type of the user interaction with the first touch sensor from the first input. Based on an analysis of the received first input, the processing device may identify characteristics of the user interaction with the first touch sensor that may indicate the type and/or a quality of the user interaction with the first touch sensor. The types and/or qualities of the user interactions with the first touch sensor may be derived using various techniques, algorithms, or heuristics. For example, identifying a first type of user interaction with the first touch sensor from the first input may include identifying a first quality of a plurality of received inputs including the first input, and identifying the first type of user interaction having the first quality of the plurality of received inputs including the first input. As another example, identifying a first type of user interaction with the first touch sensor from the first input may include identifying a first quality of a plurality of received inputs including the first input, deriving a second quality from the first quality of the plurality of received inputs, and identifying the first type of user interaction having the second quality. These and further examples of analysis of the analysis of the received first input that may be executed are described further herein with reference to block 802 of the method 800 illustrated in FIG. 8.

Multiple non-exhaustive or limiting examples of types and/or a qualities for the user interaction with the first touch sensor that the processing device may identify include: a tap; a strong tap; a quick tap; multiple taps; a location of a tap; a press; a duration of a press; a pressure of a press; a location of a press; a swipe; a single finger swipe; a multiple finger swipe; a speed of a swipe, a length of a swipe, a location of a swipe; a gesture; a shape of the gesture; a hover; a height of a hover; a duration of a hover; a location of a hover; a grip; a handedness of a grip, a number of hands or fingers used for a grip, a location of a grip; a pressure of a grip; or an area of a grip; and a part of a body or object used to make the interaction.

In block 306, the processing device may identify a first sensor input data in a multisensor input data structure corresponding with the first type of user interaction. As described further herein, the mobile computing device may include a multisensor input data structure (e.g., multisensor input translation table 1100 of FIG. 11) configured to relate the combinations of a user interactions with touch sensors with multisensor input responses (e.g., action data in columns 1116, 1118 of FIG. 11). The multisensor input data structure may include sensor input data (e.g., sensor input data in columns 1102, 1104, 1106 of FIG. 11) that may represent the interactions with the touch sensors, including qualities and/or types of the interactions with the touch sensors. For example, to identify a first sensor input data in a multisensor input data structure corresponding with the first type of user interaction, the processing device may compare the first type of user interaction with a plurality of sensor input data associated with the first touch sensor, and may identify the first sensor input data from the plurality of sensor input data associated with the first touch sensor that matches the first type of user interaction. To determine whether the received first input matches a first sensor input data for a multisensor input, the processing device may compare the qualities and/or types of the user interactions with the first touch sensor of the received first input and the sensor input data in the multisensor input data structure. The processing device may determine whether the qualities and/or types of the user interactions with the first touch sensors of the received first input matches any of the sensor input data.

In block 308, the processing device may receive a second input from a second touch sensor (e.g., touch sensor 102, 104, 106, 108, 227 in FIGS. 1A-2). In some embodiments, a user may interact with a surface or area (e.g., front area 112, rear area 114, sides 116a, 116b, and top area 118 in FIGS. 1A and 1B) of the mobile computing device having the second touch sensor. The user interaction with the second touch sensor may trigger a response by the processing device or a microcontroller (e.g., microcontroller 228 in FIG. 2) associated with the second touch sensor. The response may include signals or data configured to indicate qualities of the user interactions with the second touch sensor, such as location, area, duration, direction, speed, pressure, number, frequency, or sequence of interactions with the touch sensor. In some embodiments, the processing device may be configured to derive some such qualities of the user interactions with the second touch sensor from other qualities of the user interactions with the second touch sensor, as described further herein with reference to the method 800 in FIG. 8. The processing device may receive the signals or data configured to indicate qualities of the user interactions with the second touch sensor. In some embodiments and situations, receiving a first input from a first touch sensor in block 302 and receiving a second input from a second touch sensor in block 308 may include receiving the first input and the second input concurrently.

In block 310, the processing device may identify a second type of the user interaction with the second touch sensor from the second input. Based on an analysis of the received second input, the processing device may identify characteristics of the user interaction with the second touch sensor that may indicate the type and/or a quality of the user interaction with the second touch sensor. The types and/or qualities of the user interactions with the second touch sensor may be derived using various techniques, algorithms, or heuristics. The analysis of the analysis of the received second input may be executed as described further herein with reference to block 802 of the method 800 in FIG. 8

Multiple non-exhaustive or limiting examples of types and/or a qualities for the user interaction with the second touch sensor that the processing device may identify include: a tap; a strong tap; a quick tap; multiple taps; a location of a tap; a press; a duration of a press; a pressure of a press; a location of a press; a swipe; a single finger swipe; a multiple finger swipe; a speed of a swipe, a length of a swipe, a location of a swipe; a gesture; a shape of the gesture; a hover; a height of a hover; a duration of a hover; a location of a hover; a grip; a handedness of a grip, a number of hands or fingers used for a grip, a location of a grip; a pressure of a grip; or an area of a grip; and a part of a body or object used to make the interaction.

In block 312, the processing device may identify a second sensor input data in a multisensor input data structure corresponding with the second type of user interaction. As described further herein, the mobile computing device may include a multisensor input data structure (e.g., multisensor input translation table 1100 of FIG. 11) configured to relate the combinations of a user interactions with touch sensors with multisensor input responses (e.g., action data in columns 1116, 1118 of FIG. 11). The multisensor input data structure may include sensor input data (e.g., sensor input data in columns 1102, 1104, 1106 of FIG. 11) that may represent the interactions with the touch sensors, including qualities and/or types of the interactions with the touch sensors. To determine whether the received second input matches a second sensor input data for a multisensor input, the processing device may compare the qualities and/or types of the user interactions with the second touch sensor of the received second input and the sensor input data in the multisensor input data structure. The processing device may determine whether the qualities and/or types of the user interactions with the second touch sensors of the received second input matches any of the sensor input data.

In block 314, the processing device may determine whether the first input and the second input combine as a multisensor input in an entry in the multisensor input data structure having the first sensor input data and the second sensor input data related to a multisensor input response. From matching the received first and second inputs with the first and second sensor input data in the multisensor input data structure, the processing device may identify the entries in the multisensor input data structure having the first and second sensor input data for the received first and second inputs. The entry having the first and second sensor input data for the received first and second inputs may correspond to multisensor inputs defined by the first and second sensor input data for the entry. The processing device may then execute the multisensor input response in response to determining that the first input and the second input combine as the multisensor input in the entry in the multisensor input data structure having the first sensor input data and the second sensor input data related to the multisensor input response.

In some embodiments, the processing device may determine whether the second input is received during a multisensor input sequence duration from receiving the first input in block 308, and perform the operations in blocks 310-314 as described above in response to determining that the second input is received during the multisensor input sequence duration from receiving the first input.

Figure 4:
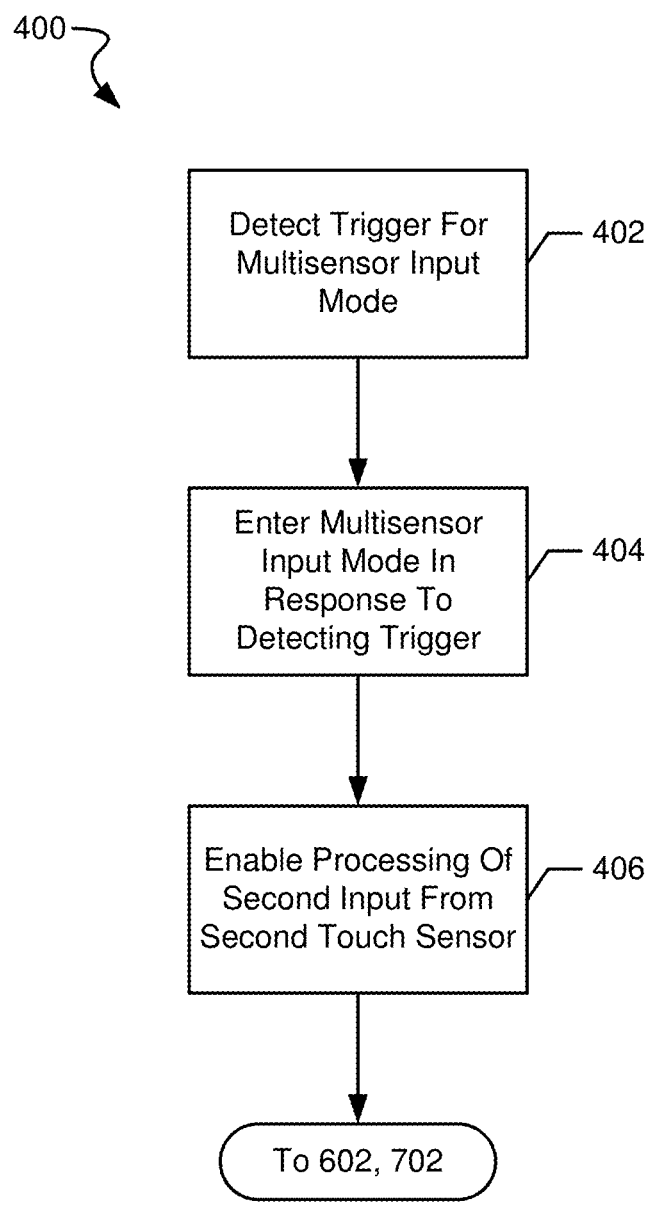
FIG. 4 is a process flow diagram illustrating a method of enabling a multisensor input mode for managing multisensor inputs according to various embodiments.

FIG. 4 illustrates a method of enabling a multisensor input mode for managing multisensor inputs according to various embodiments. With reference to FIGS. 1A-4, the method 400 may be implemented in hardware components and/or software components of the mobile computing device (e.g., 100, 200 in FIGS. 1A-2), the operation of which may be controlled by one or more processors (e.g., the general-purpose processor 206) of the mobile computing device. In order to encompass the alternative configurations enabled in various embodiments, the hardware implementing the method 400 is referred to herein as a "processing device."

In various embodiments processing of a first input from a first touch sensor may be enabled on the mobile computing device, such as in a normal input mode configured to process inputs from a set of most frequently use touch sensors, such as a touchscreen (e.g., touch sensor 102 in FIG. 1A, touchscreen 226 in FIG. 2).

In block 402, the processing device may detect a trigger for a multisensor input mode. The multisensor input mode may be configured to enable processing of user interactions with touch sensors (e.g., touch sensor 102, 104, 106, 108, 227 in FIGS. 1A-2) that otherwise may not be enabled to detect some or any user interaction. Such touch sensors may include capacitive inputs sensors of surfaces or areas (e.g., front area 112, rear area 114, sides 116*a*, 116*b*, and top area 118 in FIGS. 1A and 1B) of the mobile computing device that are not the front or touchscreen of the mobile computing device.

In some embodiments, the trigger may be a received input from a user interaction with a touch sensor, including a touch sensor configured to detect a specific user interaction to trigger the multisensor input mode but that otherwise may not be enabled to detect some or any other user interaction. For example, a unique grip for which the user places the middle and index finger close together, which is not the normal way for holding the mobile computing device. In another example, a unique tap or back/side gesture may trigger listening for other back/side gestures. In other words, the processing device may only be watching for a hard back tap, which is not normally associated with a standard holding grip. Once this unique tap is identified, then the processing device may start listening for other kinds of back/side touches.

In some embodiments, the trigger may be a signal or data received by the processing device representing a device parameter, which may be referred to as device parameter data. The device parameter data may represent any number and combination of mobile computing device parameters other than interactions with a touch sensor. For example, device parameter data may include readings or signals from other sensors of the mobile computing device, such as a light sensor, an accelerometer, a gyroscope, a temperature sensor, a voltage and/or current sensor, an infrared sensor, etc. Device parameter data may include location data of the mobile computing device, such as global positioning system (GPS) data. Device parameter data may include wired or wireless connection data of the mobile computing device, such as cellular, Wi-Fi, Bluetooth, near-filed communication (NFC), etc., or wired peripheral device connection data, including status of a connection or identification of a device to which the mobile computing device is connected. Device parameter data may include mobile computing device state data, such as a power state (e.g., full, low, charging, specific battery charge or power level, etc.) or an activity state (e.g., active, sleep, hibernate, etc.) of the mobile computing device.

In some embodiments, the trigger may include a signal or instruction processed by the processing device as part of implementation of an application executing on the mobile computing device. In some embodiments, the trigger may be a number or combination of received inputs, device parameters, or application related signals or instructions.

In block 404, the processing device may enter a multisensor input mode in response to detecting the trigger. The processing device may determine and load multisensor input data structures (e.g., multisensor input translation table 1100 of FIG. 11) configured to interpret user interactions with the multiple touch sensor inputs of the mobile computing device.

In some embodiments, the processing device may enter the multisensor input mode for different purposes depending on the trigger received, which may prompt the processing device to determine and load a multisensor input data structure associated with the specific purpose. For example, a mobile computing device front down on a surface in combination with different user interactions with a touch sensor on a back of the mobile computing device may trigger the multisensor input mode for different purposes. A tap on the touch sensor may activate a home assistant application, while a swipe along a vertical axis of the touch sensor may adjust the volume of a speaker of the mobile computing device. In another example, if the ambient brightness is very high and different from when a display brightness was last set, user interactions with a touch sensor may adjust the display brightness level.

In block 406, the processing device may enable processing of a second input from a second touch sensor. The processing device may enable a second touch sensor to detect inputs it could not previously detect and/or the processing device to processes inputs from the second touch sensor for which the processing device did not previously process inputs. In some embodiments, a second touch sensor may be activated, more frequently monitored, enabled to send inputs to the processing device, or increased in sensitivity, any of which may include enabling a microcontroller (e.g., microcontroller 228 in FIG. 2) or features of a microcontroller associated with the second touch sensor. In some embodiments, the processing device may enable itself to process all or more inputs received from the second touch sensor, or monitor or increase monitoring of the second touch sensor.

Figure 6:
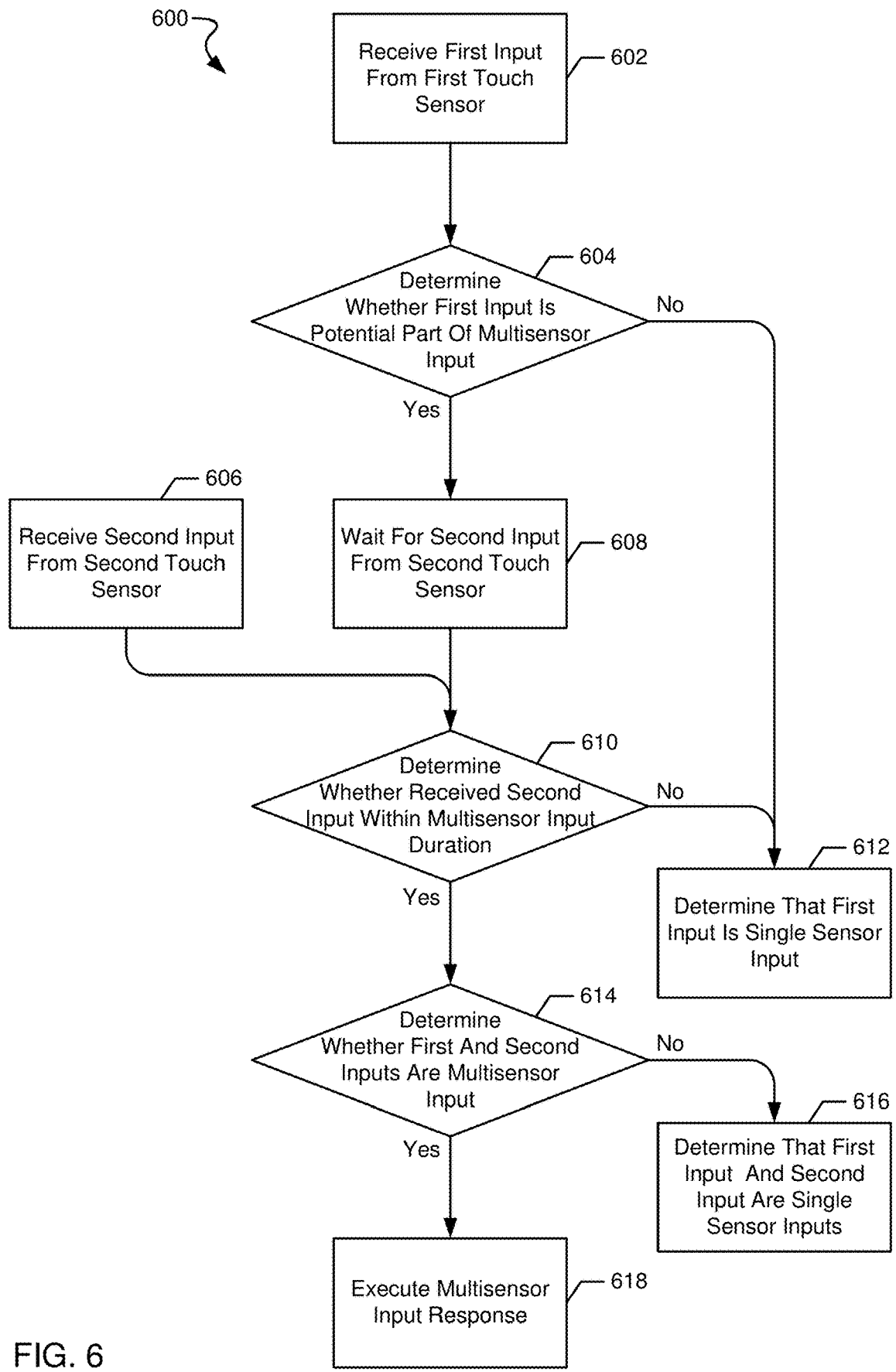
FIG. 6 is a process flow diagram illustrating a method of managing multisensor inputs received in sequence according to various embodiments.
Figure 9:
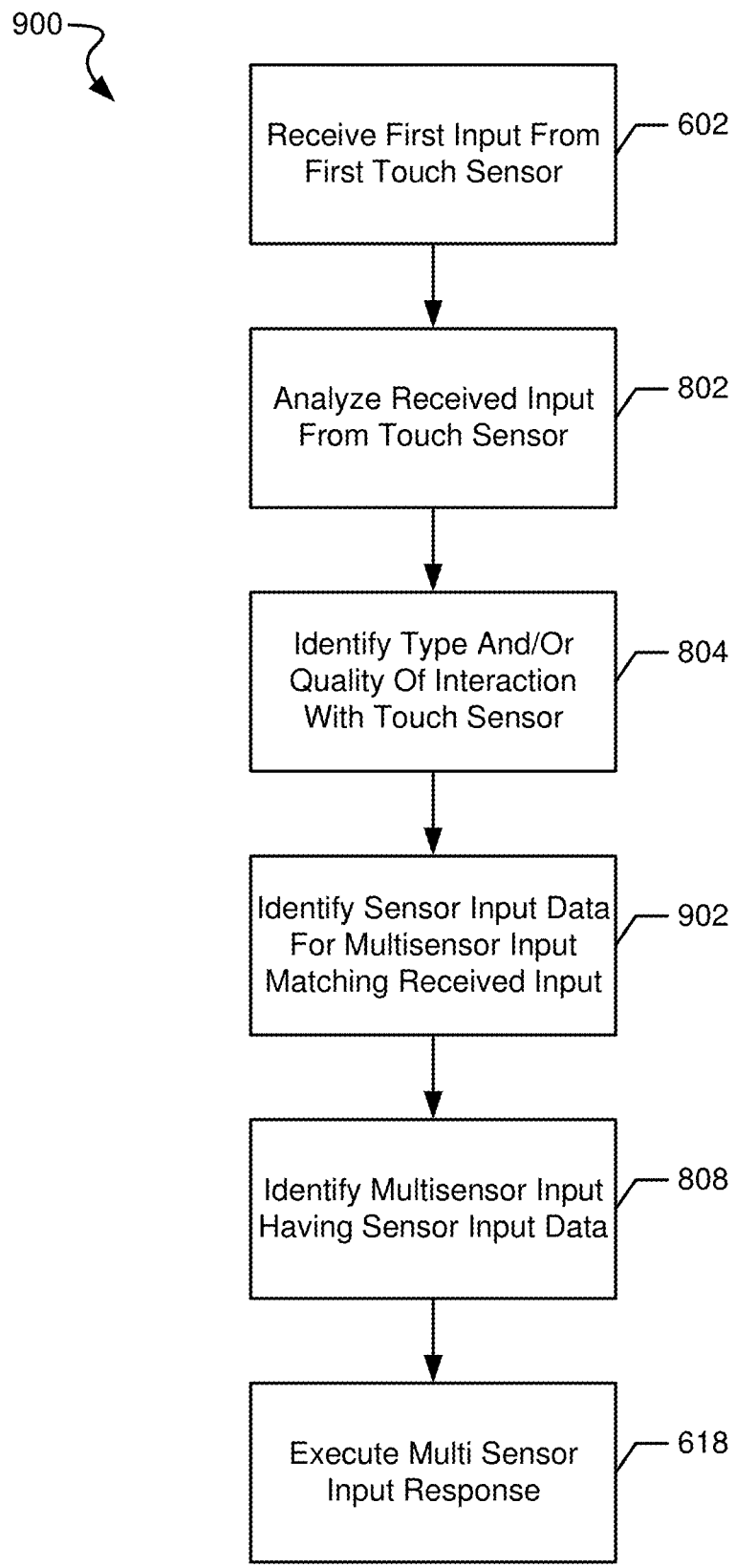
FIG. 9 is a process flow diagram illustrating a method of managing multisensor inputs received in a multisensor input mode according to various embodiments.

After enabling a second touch sensor to detect inputs it could not previously detect and/or the processing device to processes inputs from the touch sensor for which the processing device did not previously process inputs, the processing device may receive a first input from a first touch sensor in block 602 as described for the like numbered block of the method 600 with reference to FIG. 6 or the method 900 with reference to FIG. 9. Alternatively, the processing device may receive a first input from a first touch sensor and a second input from a second touch sensor in block 702 as described for the like numbered block of the method 700 with reference to FIG. 7.

Figure 5:
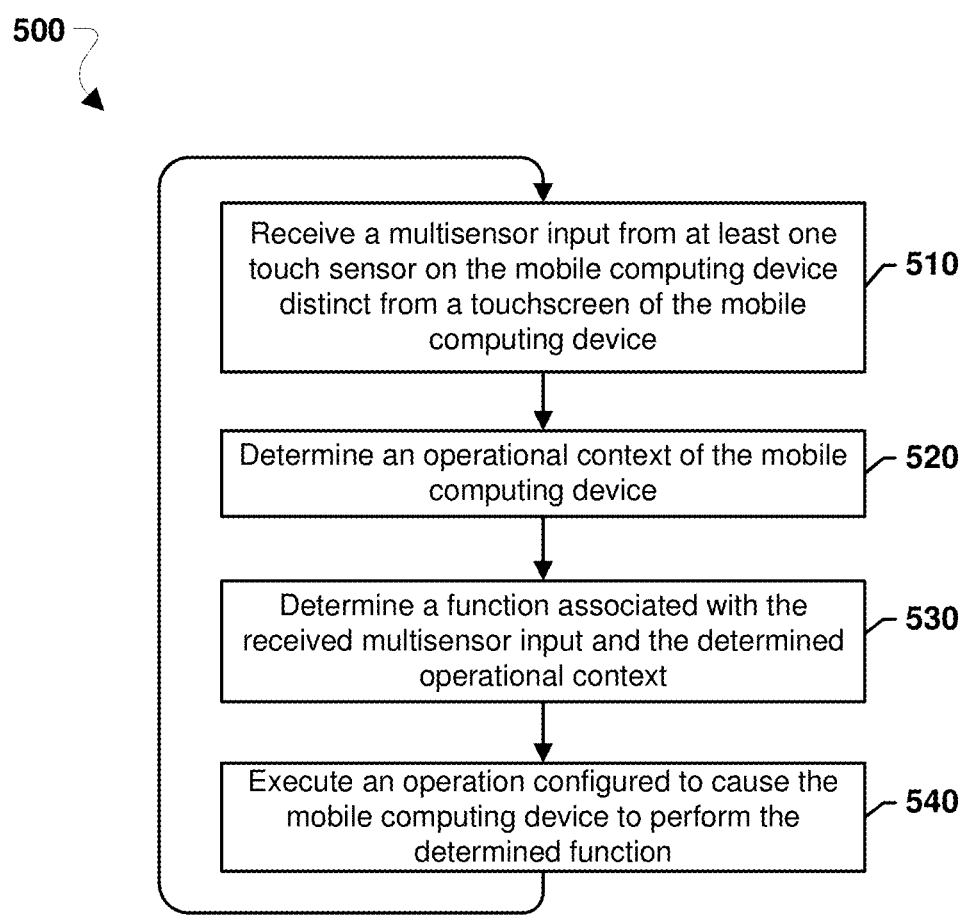
FIG. 5 is a process flow diagram illustrating an embodiment method for mapping touch sensor readings to application functions for a mobile computing device suitable for implementing various embodiments.

FIG. 5 illustrates a method 500 of integrating multi-touch inputs across multiple distinct surfaces of a mobile computing device according to various embodiments. With reference to FIGS. 1A-5, the operations of the method 500 may be implemented in hardware components and/or software components of the mobile computing device (e.g., 100, 200), the operation of which may be controlled by one or more processors (e.g., the general-purpose processor 206 and/or the microcontroller 228) of the mobile computing device.

In block 510, the processor may receive a multisensor input from at least one touch sensor on the mobile computing device distinct from a touchscreen of the mobile computing device. For example, a user touching a touch sensor on the mobile computing device, may cause a change in touch sensor state, such as capacitance, measured by the touch sensor.

The processor may receive the measured change in touch sensor state as a multisensor input. The received measurements may reflect characteristics of various types of input including a duration of contact, a number of contact points, a size of the contact point(s), a sequence or contiguous series of contacts, a pattern of simultaneous contacts, and a level of pressure or force applied during the contact. For example, as part of gripping the mobile computing device, a user touching a back-panel touch sensor, located on a back housing (e.g., rear area 114) of the mobile computing device, may cause a recognizable change in touch sensor state associated with a gripping event. As a further example, a user making a gesture on the back-panel touch sensor, like a curved swipe across a portion of the back housing, may cause a different recognizable change in touch sensor state associated with that gesture.

In block 520, the processor may determine an operational context of the mobile computing device using contextual awareness data. Contextual awareness data may include information from various sources helpful for defining the circumstances that form the setting (i.e., the operational context) in which the multisensor input(s) are received.

A multisensor input may be intended by a user to execute a first operation in a first operational context, but in a second operational context not to execute the first operation and/or to execute a second operation. For example, the processor may utilize cues from contextual awareness data to trigger a more comprehensive detection mode for multi-surface touches.

Multi-surface touches may include contact with touch sensor on different sides of the mobile computing device. For example, an application currently active on a display of the touchscreen make available additional functions or change a touch sensor detection mode of the mobile computing device.

Likewise, a position, orientation, and/or movement of the mobile computing device may provide a trigger to make available additional functions or change a touch sensor detection mode of the mobile computing device. For example, laying the mobile computing device facing flat on a table may trigger a detection mode for multi-surface touches or changes in the detection mode. Also, shaking the mobile computing device may trigger a mode that allows the user to use multi-surface touches to execute functions. As a further example, a processor may utilize environmental characteristics to trigger a particular detection mode of multi-surface touches. For example, if ambient brightness is very high and different from when the display brightness was last set, then a detected touch or movement on a back touch sensor may translate to an adjustment in brightness level.

In block 530, the processor may determine a function (e.g., a first function) associated with the multisensor input received in block 510 and the operational context determined in block 520. The determination in block 530 may involve identifying or selecting a particular multisensor input translation table or set of tables that is/are appropriate for use for the determined operational context. The appropriate multisensor input translation table(s) may provide a correlation between the multisensor input(s) receive from one or more touch sensors, and a function the processor may perform or causes another component of the mobile computing device to perform. The processor may obtain the particular translation table(s) from memory (e.g., 214 in FIG. 2). Alternatively or additionally, the determination in block 530 may involve cascading rules set and/or parametric method that applies the determined operational context and the received multisensor input to determine the function.

In block 540, the processor may execute an operation configured to cause the mobile computing device to perform the function determined in block 530. The executed operation may change settings controlling touch sensors, change which multisensor input translation table is used, or change a function associated with touch sensors. For example, when a user performs a first "trigger" gesture on the back of the mobile computing device that the processor recognizes, within a predetermined period the processor may receive a shortcut gesture configured to launch a particular application on the mobile computing device, in the next few seconds. Additionally or alternatively, the executed operation may change other settings of the mobile computing device. Further, the executed operations may transmit a message and/or instruction to another component for executing the determined function. For example, to perform operations associated with the mobile computing device generally and/or applications active on the mobile computing device.

In some embodiments, the processor may repeat the operations of the method 500 to map further touch sensor readings to application functions for a mobile computing device. Executing the operations of the method 500 may change the operational context, thus changing or making available additional functions associated with received multisensor inputs. For example, the multisensor input received in block 510 may represent a unique grip on the mobile computing device, like the user placing the middle and index finger close together, which is not the normal way of holding the mobile computing device.

In addition, an operational context of the mobile computing device may include a state in which multi-surface contact is not recognized as an input function (i.e., multi-surface controls are off). In this way, receiving multisensor inputs corresponding to the unique grip when multi-surface controls are off may trigger an operation in block 540 that turns multi-surface controls on.

As another example, the multisensor input received in block 510 may represent a unique tap or back/side gesture configured to unlock other back/side gestures. In this way, the device may be configured to monitor for a hard back-tap (which is not normally associated with a standard holding grip). Once such a hard back-tap is identified, the processor may monitor for other kinds of back/side touches that trigger recently unavailable functions. Similarly, a unique tap or back/side gesture may trigger the processor to listen for other subsequent back/side gestures. For example, the processor may always monitor for a particular touch profile, like from a hard tap on a back of the mobile computing device, which is not normally associated with a standard grip on the device. Once that particular touch profile is detected, then the processor may start monitoring for other kinds of touch profiles.

The processor may repeat the operations of the method 500 in response to receipt of additional multisensor inputs in block 510. As another example, the processor may repeat the operations of the method 500 for a predefined number of iterations or a predefined period indicated in parameters associated with an active application on the mobile computing device.

In various embodiments, the descriptions herein with reference to the methods 600, 700, 800, 900 in FIGS. 6-9 provide further descriptions, features, and embodiments of and/or relating to the methods 300, 400 described with reference to in FIGS. 3 and 4.

FIG. 6 illustrates a method of managing multisensor inputs received in sequence according to various embodiments. With reference to FIGS. 1A-6, the method 600 may be implemented in hardware components and/or software components of the mobile computing device (e.g., 100, 200 in FIGS. 1A-2), the operation of which may be controlled by one or more processors (e.g., the general-purpose processor 206) of the mobile computing device. In order to encompass the alternative configurations enabled in various embodiments, the hardware implementing the method 600 is referred to herein as a "processing device."

In block 602, the processing device may receive a first input from a first touch sensor (e.g., touch sensor 102, 104, 106, 108, 227 in FIGS. 1A-2). In some embodiments, a user may interact with a surface or area (e.g., front area 112, rear area 114, sides 116a, 116b, and top area 118 in FIGS. 1A and 1B) of the mobile computing device having a touch sensor. The user interaction with a touch sensor may trigger a response by the processing device or a microcontroller (e.g., microcontroller 228 in FIG. 2) associated with the touch sensor. The response may include signals or data configured to indicate qualities of the interactions with the touch sensor, such as location, area, duration, direction, speed, pressure, number, frequency, or sequence of interactions with the touch sensor. In some embodiments, the processing device may be configured to derive some such qualities of the interactions with the touch sensor from other qualities of the interactions with the touch sensor, as described further herein with reference to the method 800 in FIG. 8. The processing device may receive the signals or data configured to indicate qualities of the interactions with the touch sensor.

In determination block 604, the processing device may determine whether the first input from the first touch sensor is a potential part of a multisensor input. In some embodiments, a multisensor input may be a combination of a user interaction with a first touch sensor and a user interaction with a second touch sensor. Specific combinations of a user interaction with a first touch sensor and a user interaction with a second touch sensor may define a multisensor input by being associated with a multisensor input response to the multisensor input.

In some embodiments, definitions of multisensor inputs may be stored on the mobile computing device in a memory (e.g., memory 214 of FIG. 2) of the mobile computing device. For example, the definitions of multisensor inputs may be stored in a multisensor input data structure (e.g., multisensor input translation table 1100 of FIG. 11) configured to relate the combinations of a user interaction with a first touch sensor and a user interaction with a second touch sensor with multisensor input responses.

To determine whether the first input is a potential part of a multisensor input in determination block 604, the processing device may compare the first input with data (e.g., sensor input data in columns 1102, 1104, 1106 of FIG. 11) in the multisensor input data structure associated with the first touch sensor. It is possible that the first input may be determined to be part of any number of multisensor inputs, but subsequent second inputs from a second touch sensor may not fit the definitions of a multisensory input in combination with the first input. Therefore, it may be that the first input is determined to be a potential part of a multisensor input, because it may be uncertain that the second input of a multisensor input will succeed the first input. In such circumstances, the first input may not be combined with the second input to trigger a multisensor input response, described further here in with reference to block 612.

In response to determining that the first input from the first touch sensor is not a potential part of a multisensor input (i.e., determination block 604="No"), the processing device may determine that the first input is a single sensor input in block 612. The processing device may not identify the first input in a definition of a multisensor input in determination block 604. As such, there may not be any need to continue to determine whether a successive second input from a second touch sensor in combination with the first input combine to make a multisensor input. Therefore, the processing device may classify the first input as a single sensor input and terminate the instance of the method 600 triggered by receiving the first input from a first touch sensor in block 602.

In response to determining that the first input from the first touch sensor is a potential part of a multisensor input (i.e., determination block 604="Yes"), the processing device may wait for a second input from a second touch sensor in block 608. In some cases, the multisensor input may be a combination of the first user interaction with the first touch sensor and the second user interaction with the second touch sensor in a sequence within a multisensor input sequence duration. The multisensor input sequence duration may represent a designated period, such as time, transistor flops, etc., from receiving the first input during which the processing device may receive the second input. The processing device may wait the multisensor input sequence duration before responding to the first input to allow the user an opportunity to interact with the second touch sensor to implement a multisensor input as a sequence of inputs on the first and second touch sensors.

In determination block 610, the processing device may determine whether the second input from the second touch sensor is received during the multisensor input sequence duration. In some embodiments, the processing device may receive the second input during the multisensor input sequence duration, and in some embodiments, the multisensor input sequence duration may expire before the processing device receives a second input.

Inputs received after the multisensor input sequence duration may be treated as new first inputs. Thus, in response to determining that the second input from the second touch sensor is not received during the multisensor input sequence duration (i.e., determination block 610="No"), the processing device may determine that the first input is a single sensor input in block 612 as described herein.

In some embodiments, the processing device may receive a second input from a second touch sensor (e.g., touch sensor 102, 104, 106, 108, 227 in FIGS. 1A-2) in block 606 at any time after receiving the first input from the first touch sensor in block 602 and before determining that the second input from the second touch sensor is not received during the multisensor input sequence duration in determination block 610. In some embodiments, a user may interact with a second surface or second area (e.g., front area 112, rear area 114, sides 116a, 116b, and top area 118 in FIGS. 1A and 1B) of the mobile computing device having a second touch sensor. The user interaction with the second touch sensor may trigger a response in the same manner as described with reference to block 602.

In some embodiments, the processing device may run multiple instances of the method 600 in parallel, and the second input received in block 606 in other instances of the method 600 may be handled as the first instance received in block 602.

After receiving the second input from the second touch sensor in block 606 and in response to determining that the second input from the second touch sensor is received during the multisensor input sequence duration (i.e., determination block 610="Yes"), the processing device may determine whether the first input from the first touch sensor and the second input from the second touch sensor combine as a multisensor input in determination block 614. Similar to determining whether the first input is a potential part of a multisensor input in determination block 604, the processing device may use the multisensor input data structure configured to relate combinations of user interactions with a first touch sensor and a second touch sensor with multisensor input responses to determine whether the second input combines with the first input as a multisensor input. In some embodiments, the processing device may compare the second input with data (e.g., sensor input data in columns 1102, 1104, 1106 of FIG. 11) in the multisensor input data structure to determine whether the second input matches any entries of the multisensor input data structure, and compare the entries with entries that match the first input identified in determination block 604. In some embodiments, the processing device may compare the second input with data in the entries of the multisensor input data structure that match the first input identified in determination block 604. Matching entries for the first input and the second input or data for the second input in entries for the first input may indicate that the first input and the second input define a multisensor input in the multisensor input data structure. No matching entries for the first input and the second input or data for the second input in entries for the first input may indicate that the first input and the second input do not define a multisensor input in the multisensor input data structure.

In response to determining that the first input from the first touch sensor and the second input from the second touch sensor do not combine as a multisensor input (i.e., determination block 614="No"), the processing device may determine that the first input and the second input are single sensor inputs in block 616. Similar to determining that the first input is a single sensor input in block 612, the processing device may not identify the combination of the first input and the second input in a definition of a multisensor input in determination block 614. As such, there may not be any need to continue implementing the method 600 for the combination of the first input and the second input. Therefore, the processing device may classify the first input and the second input as single sensor inputs and terminate the instance of the method 600 triggered by receiving the first input from a first touch sensor in block 602.

In response to determining that the first input from the first touch sensor and the second input from the second touch sensor do combine as a multisensor input (i.e., determination block 614="Yes"), the processing device may execute a multisensor input response in block 618. As described herein, the multisensor input data structure may relate the multisensor input and a multisensor input response. The processing device may execute code (e.g., action data in columns 1116, 1118 in FIG. 11) of the multisensor input response from the multisensor input data structure or referenced to (e.g., action data in columns 1116, 1118 in FIG. 11) from the multisensor input data structure.

Figure 7:
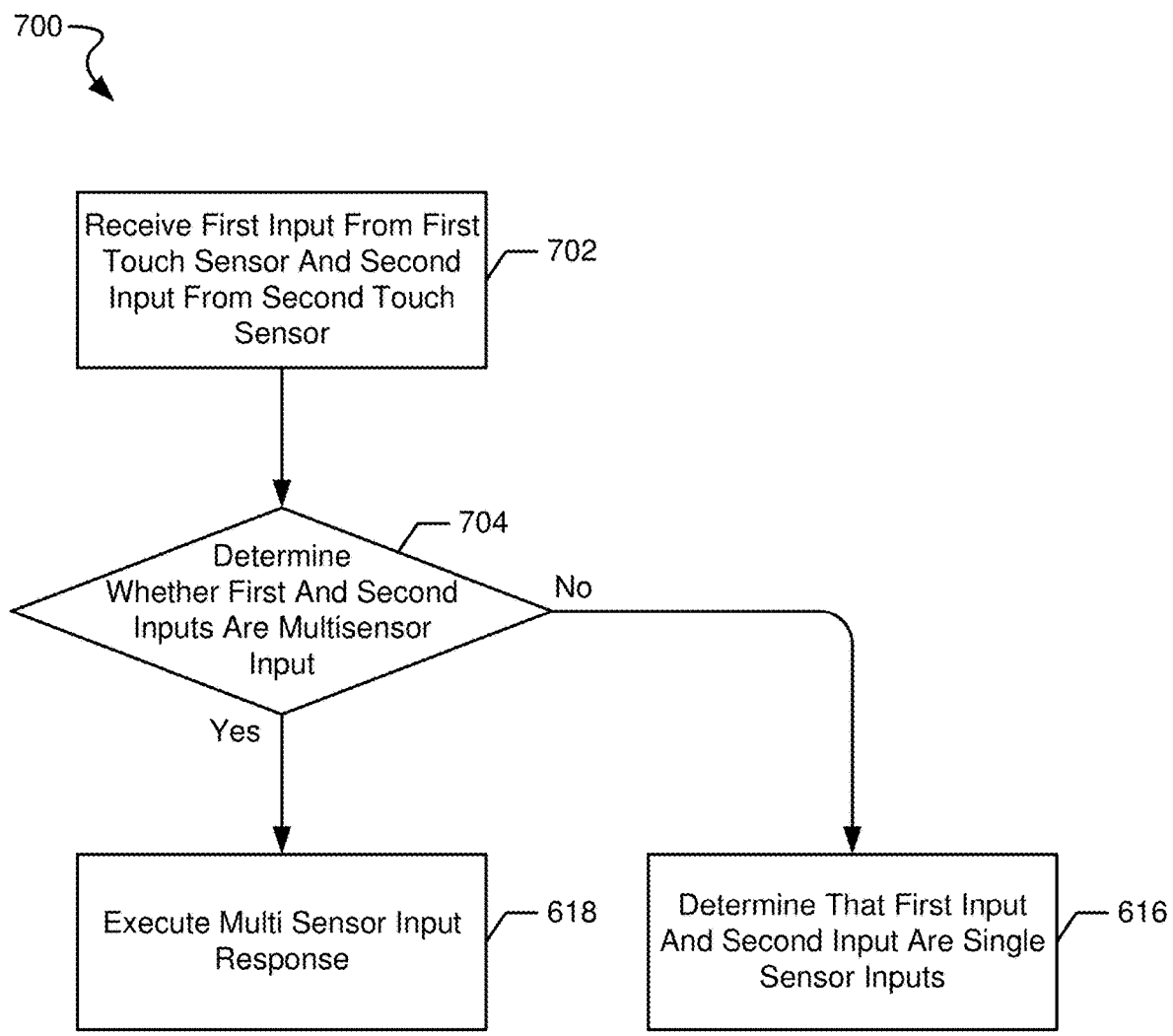
FIG. 7 is a process flow diagram illustrating a method of managing multisensor inputs received simultaneously according to various embodiments.

FIG. 7 illustrates a method of managing multisensor inputs received simultaneously according to various embodiments. With reference to FIGS. 1A-7, the method 700 may be implemented in hardware components and/or software components of the mobile computing device (e.g., 100, 200 in FIGS. 1A-2), the operation of which may be controlled by one or more processors (e.g., the general-purpose processor 206) of the mobile computing device. In order to encompass the alternative configurations enabled in various embodiments, the hardware implementing the method 700 is referred to herein as a "processing device."

In some embodiments, blocks 616 and 618 may be implemented in manners similar to those for like numbered blocks of the method 600 described with reference to in FIG. 6.

In block 702, the processing device may receive a first input from a first touch sensor (e.g., touch sensor 102, 104, 106, 108, 227 in FIGS. 1A-2) and a second input from a second touch sensor (e.g., touch sensor 102, 104, 106, 108, 227 in FIGS. 1A-2). In some embodiments, a user may interact with multiple surfaces or areas (e.g., front area 112, rear area 114, sides 116a, 116b, and top area 118 in FIGS. 1A and 1B) of the mobile computing device having touch sensors. The user interactions with the touch sensors may trigger responses by the processing device or microcontrollers (e.g., microcontroller 228 in FIG. 2) associated with the touch sensors. The responses may include signals or data configured to indicate qualities of the interactions with the touch sensors, such as location, area, duration, direction, speed, pressure, number, frequency, or sequence of interactions with the touch sensor. In some embodiments, the processing device may be configured to derive some such qualities of the interactions with the touch sensors from other qualities of the interactions with the touch sensor, as described further herein with reference to the method 800 in FIG. 8. The processing device may receive the signals or data configured to indicate qualities of the interactions with the touch sensors. In some embodiments, the user interactions with the touch sensors may occur simultaneously or concurrently. Similarly, the processing device may receive the first input and the second input simultaneously or concurrently.

In determination block 704, the processing device may determine whether the first input from the first touch sensor and the second input from the second touch sensor combine as a multisensor input. In some embodiments, a multisensor input may be a combination of a user interaction with a first touch sensor and a user interaction with a second touch sensor. Specific combinations of a user interaction with a first touch sensor and a user interaction with a second touch sensor may define a multisensor input by being associated with a multisensor input response to the multisensor input. In some embodiments, definitions of multisensor inputs may be stored on the mobile computing device in a memory (e.g., memory 214 of FIG. 2) of the mobile computing device. For example, the definitions of multisensor inputs may be stored in a multisensor input data structure (e.g., multisensor input translation table 1100 of FIG. 11) configured to relate the combinations of a user interaction with a first touch sensor and a user interaction with a second touch sensor with multisensor input responses. To determine whether the first input and the second input combine as a multisensor input, the processing device may compare the first input with data (e.g., sensor input data in columns 1102, 1104, 1106 of FIG. 11) in the multisensor input data structure associated with the first touch sensor and the second input with data (e.g., sensor input data in columns 1102, 1104, 1106 of FIG. 11) in the multisensor input data structure associated with the second touch sensor. In some embodiments, the processing device may compare the first input and the second input with data in the multisensor input data structure to determine whether the first input and the second input match any entries of the multisensor input data structure, and compare the entries for the first input and the entries for the second input with each other to find matching entries. In some embodiments, the processing device may compare the second input with data in the entries of the multisensor input data structure that match the first input. Matching entries for the first input and the second input or data for the second input in entries for the first input may indicate that the first input and the second input define a multisensor input in the multisensor input data structure. It is possible that either the first input and/or the second may be identified as part of any number of multisensor inputs, but not for the same definition of a multisensory input in combination. No matching entries for the first input and the second input or data for the second input in entries for the first input may indicate that the first input and the second input do not define a multisensor input in the multisensor input data structure.

In response to determining that the first input from the first touch sensor and the second input from the second touch sensor do not combine as a multisensor input (i.e., determination block 704="No"), the processing device may determine that the first input and the second input are single sensor inputs in block 616.

In response to determining that the first input from the first touch sensor and the second input from the second touch sensor do combine as a multisensor input (i.e., determination block 704="Yes"), the processing device may execute a multisensor input response in block 618.

Figure 8:
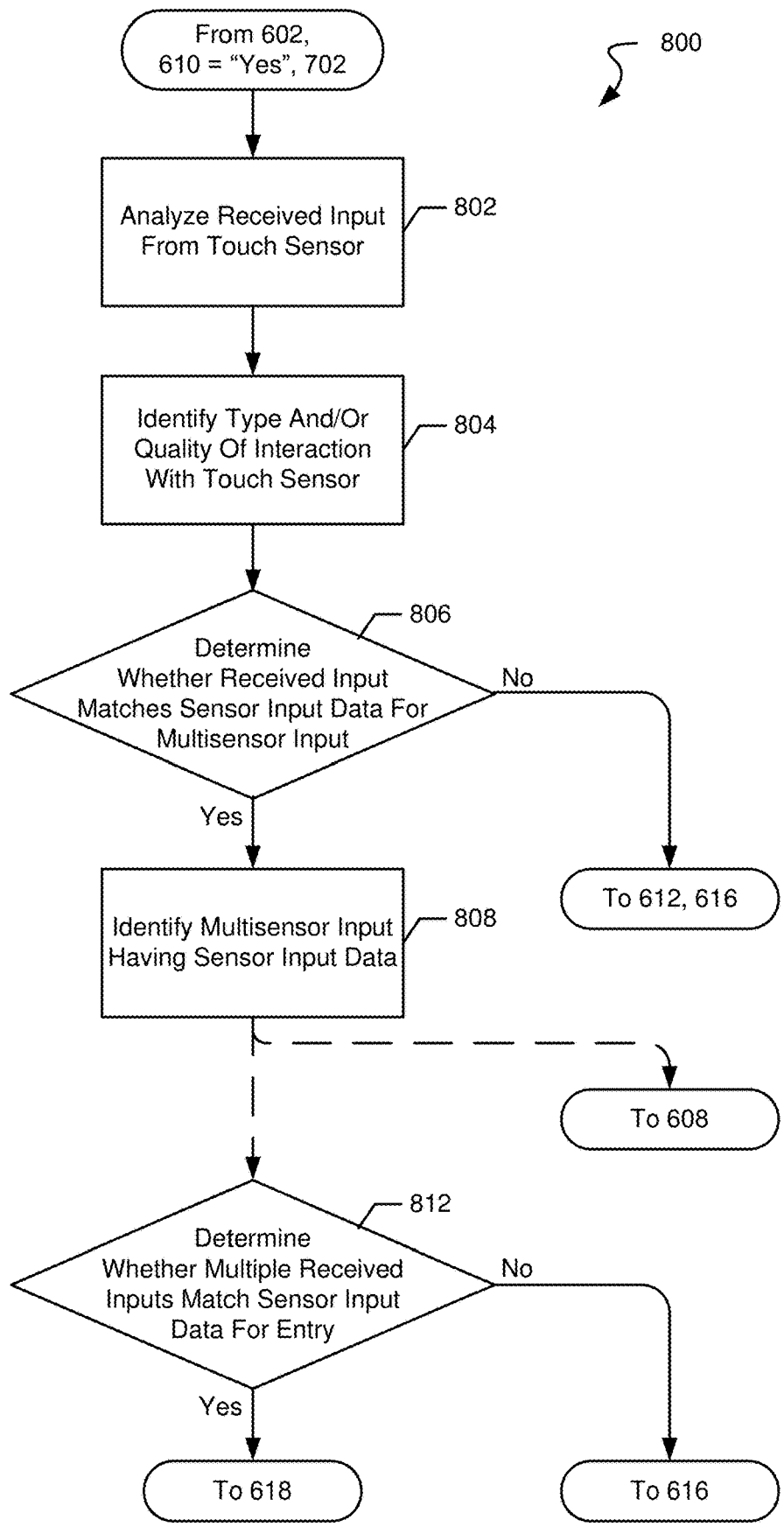
FIG. 8 is a process flow diagram illustrating a method of determining whether received inputs are multisensor inputs are according to various embodiments.

FIG. 8 illustrates a method of determining whether received inputs are multisensor inputs are according to various embodiments. With reference to FIGS. 1A-8, the method 800 may be implemented in hardware components and/or software components of the mobile computing device (e.g., 100, 200 in FIGS. 1A-2), the operation of which may be controlled by one or more processors (e.g., the general-purpose processor 206) of the mobile computing device. In order to encompass the alternative configurations enabled in various embodiments, the hardware implementing the method 800 is referred to herein as a "processing device."

In block 802, the processing device may analyze a received input from a touch sensor (e.g., touch sensor 102, 104, 106, 108, 227 in FIGS. 1A-2). The received input may be any of the first input received from the first touch sensors and the second input received from the second touch sensor as described for blocks 602, 604, AND 702 of the methods 600 and 700 with reference to FIGS. 6 and 7. The received input may include multiple received inputs that combine to make a single user interaction with the touch sensor. As described herein, the received input may include signals or data configured to indicate qualities of the interactions with the touch sensors, such as location, area, duration, direction, speed, pressure, number, frequency, or sequence of interactions with the touch sensor. The processing device may identify from the received input any of the qualities indicated by the received input. The processing device may also derive qualities of the received input from the identified qualities of the received input. For example, the identified qualities of the received input may include only location of the user interaction with a touch sensor, which may indicate a touch sensor in an array of touch sensors or a location on a touch sensor. Multiple locations may be included in the received input.

The processing device may determine the changes in the locations of the received input in relation to time. From the changes in the locations of the received input in relation to time, the processing device may determine qualities of the received input.

Multiple non-exhaustive or limiting examples follow. The processing device may determine a duration of the received input based on a time for which locations are recorded. The processing device may determine a direction of the received input based on changes in the location. The processing device may determine a speed of the received input based on changes in location in relation to time. The processing device may determine an area covered by the received input based on the locations recorded. The processing device may determine a pressure at location of the received input based on a pattern of the locations recorded with reference to time. The processing device may determine a number of interactions with the touch sensor of the received input based on a pattern of locations and lack of locations recorded. The processing device may determine a frequency of the interactions with the touch sensor of the received inputs based on a pattern of locations and lack of locations recorded with reference to time. The processing device may determine a sequence of the interactions with the touch sensor of the received inputs based on a pattern of locations and lack of locations recorded and other received or derived qualities with reference to time. The qualities of the received input may be derived using various techniques, algorithms, or heuristics.

In block 804, the processing device may identify a type and/or a quality of the interaction with the touch sensor. Based on the analysis of the received input, the processing device may identify characteristics of the interaction with the touch sensor that may indicate the type and/or quality of the interaction with the touch sensor. The qualities and/or types of the interactions with the touch sensor may be derived using various techniques, algorithms, or heuristics.

Multiple non-exhaustive or limiting examples of types and/or a qualities for the interaction with the touch sensor that the processing device may identify include: a tap; a strong tap; a quick tap; multiple taps; a location of a tap; a press; a duration of a press; a pressure of a press; a location of a press; a swipe; a single finger swipe; a multiple finger swipe; a speed of a swipe, a length of a swipe, a location of a swipe; a gesture; a shape of the gesture; a hover; a height of a hover; a duration of a hover; a location of a hover; a grip; a handedness of a grip, a number of hands or fingers used for a grip, a location of a grip; a pressure of a grip; or an area of a grip; a part of a body or object used to make the interaction.

In determination block 806, the processing device may determine whether the received input matches sensor input data for a multisensor input. As described herein, the mobile computing device may include a multisensor input data structure (e.g., multisensor input translation table 1100 of FIG. 11) configured to relate the combinations of a user interactions with touch sensors with multisensor input responses (e.g., action data in columns 1116, 1118 of FIG. 11). The multisensor input data structure may include sensor input data (e.g., sensor input data in columns 1102, 1104, 1106 of FIG. 11) that may represent the interactions with the touch sensors, including qualities and/or types of the interactions with the touch sensors. To determine whether the received input matches sensor input data for a multisensor input, the processing device may compare the qualities and/or types of the interactions with the touch sensors of the received input and the sensor input data in the multisensor input data structure. The processing device may determine whether the qualities and/or types of the interactions with the touch sensors of the received input matches any of the sensor input data.

In response to determining that the received input does not match any sensor input data for a multisensor input (i.e. determination block 806="No"), the processing device may determine that the received input is a single sensor input in block 612 as described for the like numbered block of the method 600 with reference to FIG. 6, or the processing device may determine that multiple received inputs are single sensor inputs in block 616 as described for the like numbered block of the method 600 with reference to FIG. 6 or the method 700 with reference to FIG. 7.

In response to determining that the received input does match sensor input data for a multisensor input (i.e. determination block 806="Yes"), the processing device may identify a multisensor input having the sensor input data in block 808. As described herein, the multisensor input data structure may include entries (e.g., row 1120, 1122, 1124, 1126, 1128, 1130 of FIG. 11) relating the sensor input data with a multisensor input response. From matching the received input with sensor input data, the processing device may identify the entries in the multisensor input data structure having the sensor input data. In some embodiments, further factors, including a device parameter (e.g., device parameter data in columns 1108, 1110 of FIG. 11) of the mobile computing device or an application (e.g., application data in columns 1112, 1114 of FIG. 11) running on the mobile computing device, may be considered in identifying a multisensor input.

In some embodiments, a device parameter or an application may be an additional factor to match in the entries of the multisensor input data structure to identify a multisensor input. In some embodiments, a device parameter or an application may be used instead of a second input from a second touch sensor, and the match may be based on a single input and a device parameter or an application. The entries may correspond to multisensor inputs defined by the sensor input data for the entry.

In some embodiments in which only one input is received, the processing device may wait for a second input from a second touch sensor in block 608 as described for the like numbered block of the method 600 with reference to FIG. 6.

In some embodiments in which multiple inputs are received, the processing device may determine whether multiple received inputs match sensor input data for an entry in determination block 812. From matching the received inputs with sensor input data, the processing device may identify the entries in the multisensor input data structure having the sensor input data for multiple received inputs. The entry having the sensor input data for multiple received inputs may correspond to multisensor inputs defined by the sensor input data for the entry.

In response to determining that multiple received inputs match sensor input data for an entry (i.e., determination block 812="Yes"), the processing device may execute a multisensor input response in block 618 as described for the like numbered block of the method 600 with reference to FIG. 6 or the method 700 with reference to FIG. 7.

In response to determining that multiple received inputs do not match sensor input data for an entry (i.e., determination block 812="No"), the processing device may determine that multiple received inputs are single sensor inputs in block 616 as described for the like numbered block of the method 600 with reference to FIG. 6 or the method 700 with reference to FIG. 7.

FIG. 9 illustrates a method of managing multisensor inputs received in a multisensor input mode according to various embodiments. With reference to FIGS. 1A-9, the method 900 may be implemented in hardware components and/or software components of the mobile computing device (e.g., 100, 200 in FIGS. 1A-2), the operation of which may be controlled by one or more processors (e.g., the general-purpose processor 206) of the mobile computing device. In order to encompass the alternative configurations enabled in various embodiments, the hardware implementing the method 900 is referred to herein as a "processing device."

In some embodiments, blocks 602, 618 may be implemented in manners similar to those described for like numbered blocks of the method 600 with reference to FIG. 6, and blocks 802, 804, 808 may be implemented in manners similar to those described for like numbered blocks of the method 800 with reference to FIG. 8.

In block 602, the processing device may receive a first input from a first touch sensor (e.g., touch sensor 102, 104, 106, 108, 227 in FIGS. 1A-2). In block 802, the processing device may analyze a received input from a touch sensor. In block 804, the processing device may identify a type and/or a quality of the interaction with the touch sensor.

In block 902, the processing device may identify sensor input data (e.g., sensor input data in columns 1102, 1104, 1106 of FIG. 11) for a multisensor input matching a received input. As described herein, the mobile computing device may include a multisensor input data structure (e.g., multisensor input translation table 1100 of FIG. 11) configured to relate a user interaction with touch sensors with multisensor input responses (e.g., action data in columns 1116, 1118 of FIG. 11). The multisensor input data structure may include sensor input data that may represent the interactions with the touch sensors, including qualities and/or types of the interactions with the touch sensors. To identify a received input that matches a sensor input data for a multisensor input, the processing device may compare the qualities and/or types of the interactions with the touch sensors of the received input and the sensor input data in the multisensor input data structure. The processing device may determine whether the qualities and/or types of the interactions with the touch sensors of the received input matches any of the sensor input data.

In block 808, the processing device may identify a multisensor input having the sensor input data. In block, 618 the processing device may execute a multisensor input response.

Figure 10:
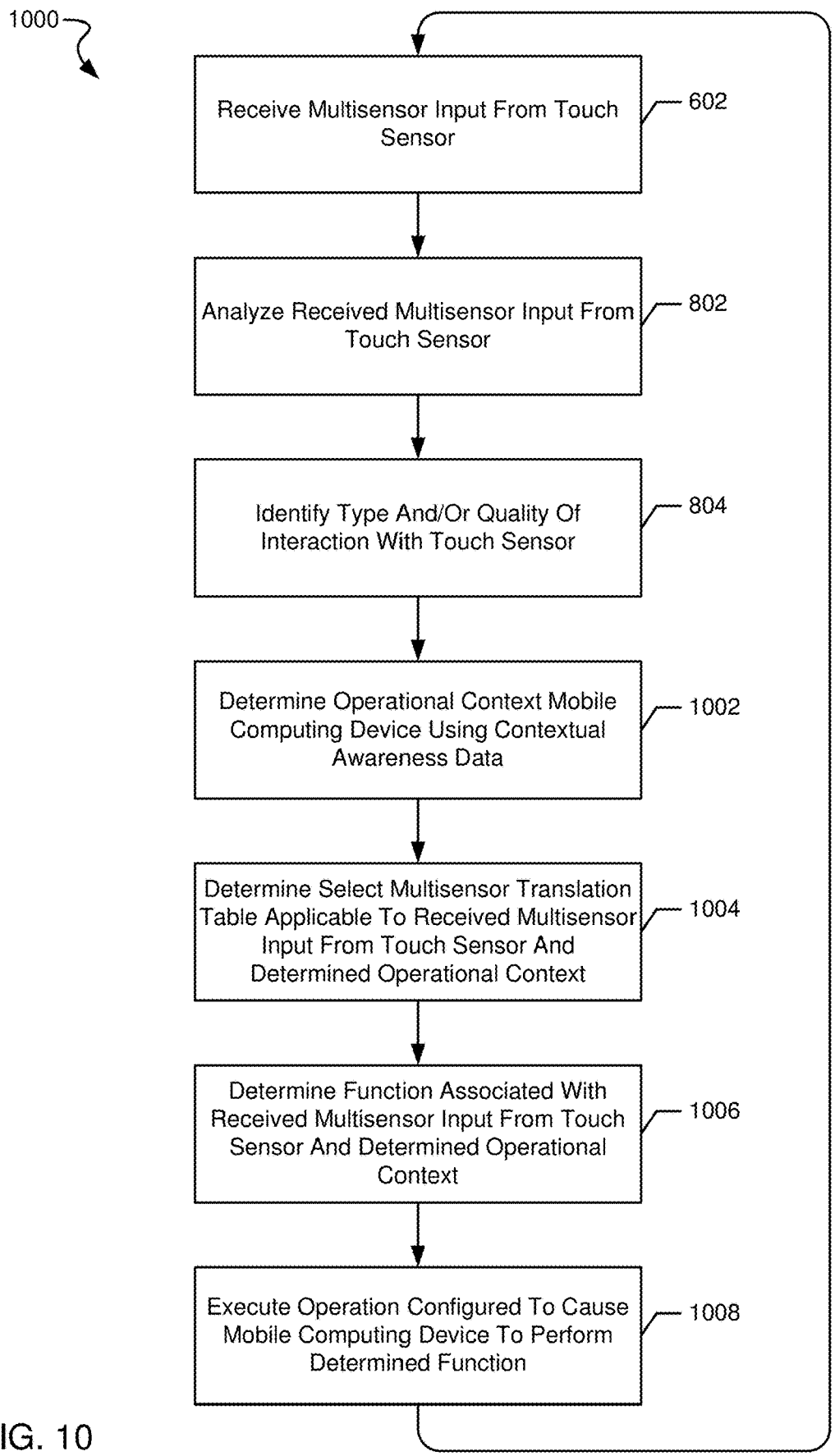
FIG. 10 is a process flow diagram illustrating a method of integrating multi-touch inputs across multiple distinct surfaces of a mobile computing device according to various embodiments.

In various embodiments, the descriptions of the method 1000 in FIG. 10 provide further descriptions, features, and embodiments of and/or relating to the method 500 described with reference to FIG. 5.

FIG. 10 illustrates a method of integrating multi-touch inputs across multiple distinct surfaces of a mobile computing device according to various embodiments. With reference to FIGS. 1A-10, the method 1000 may be implemented in hardware components and/or software components of the mobile computing device (e.g., 100, 200 in FIGS. 1A-2), the operation of which may be controlled by one or more processors (e.g., the general-purpose processor 206) of the mobile computing device. In order to encompass the alternative configurations enabled in various embodiments, the hardware implementing the method 1000 is referred to herein as a "processing device."

In some embodiments, block 602 may be implemented as described for the like numbered block of the method 600 with reference to FIG. 6, and blocks 802, 804 may be implemented as described for the like numbered blocks of the method 800 with reference to FIG. 8.

In block 602, the processing device may receive a first multisensor input from at least a first touch sensor (e.g., touch sensor 102, 104, 106, 108, 227 in FIGS. 1A-2). In various embodiments, the first touch sensor may be any touch sensor distinct from a touchscreen (e.g., touchscreen 226 of FIG. 2) of the mobile computing device.

In block 802, the processing device may analyze a received first multisensor input from at least the first touch sensor.

In block 804, the processing device may identify a type and/or a quality of the interaction with at least the touch sensor.

In block 1002, the processing device may determine an operational context of the mobile computing device by using contextual awareness data. The operational context of the mobile computing device may be determined by combining or fusing, such as by an inference engine, a plurality of data. Such data may include data associated with the received first multisensor input from at least the first touch sensor, parameters from one or more active applications, and/or state information from one or more components associated with the mobile communication device, such as a multitude of different types of data relevant to conditions under which multisensor inputs are received.

In some embodiments, the processing device may combine or fuse both real-time and non-real time contextual awareness data associated with conditions under which multisensor inputs are received in order to determine the operational context. Contextual awareness data may include any suitable type of real-time and/or non-real-time data associated with the mobile computing device. Examples of such contextual awareness data may include, as described further herein with reference to FIG. 12, touchscreen active application parameters 1210, background active application parameters 1220, a touchscreen state 1230, other onboard component(s) state(s) 1240, a peripheral component state 1250, multisensor input details 1260, other sensor inputs 1270, and any other suitable contextual awareness data, and/or any combination thereof.

In block 1004, the processing device may determine a select multisensor translation table (e.g., multisensor input translation table 1100 of FIG. 11) applicable to received first multisensor input from at least the first touch sensor and the determined operational context. The mobile computing device may store any number of multisensor translation tables. In various embodiments, different ones of the multisensor translation tables may be associated with a multisensor input, including a type and/or a quality of the interaction with at least the touch sensor, and/or with an operational context of the mobile computing device. The processing device may determine which of the stored multisensor translation table is associated with the received first multisensor input from at least the first touch sensor and the determined operational context.

In block 1006, the processing device may determine a first function associated with the received first multisensor input from at least the first touch sensor and the determined operational context. The processing device may consider the received first multisensor input from at least the first touch sensor in the determined operational context to determine a particular function to execute.

In some embodiments, a determined first function may be based on a lookup of the received first multisensor input from at least the first touch sensor on the select multisensor translation table. The processing device may determine whether the received first multisensor input from at least the first touch sensor matches sensor input data for a multisensor input. As described herein, a multisensor input translation table configured to relate the combinations of a user interactions with touch sensors with functions, or multisensor input responses, (e.g., action data in columns 1116, 1118 of FIG. 11, and further examples described herein with reference to FIGS. 9-30B). The multisensor input translation table may include sensor input data (e.g., sensor input data in columns 1102, 104, 1106 of FIG. 11) that may represent the interactions with the touch sensors, including qualities and/or types of the interactions with the touch sensors.

To determine whether the received first multisensor input from at least the first touch sensor matches sensor input data for a multisensor input, the processing device may compare the qualities and/or types of the interactions with the touch sensors of the received first multisensor input and the sensor input data in the multisensor input data structure. The processing device may determine whether the qualities and/or types of the interactions with the touch sensors of the received first multisensor input from at least the first touch sensor matches any of the sensor input data. The processing device may determine the first function as a function associated with a matching sensor input data in the select multisensor translation table.

In block 1008, the processing device may execute a first operation configured to cause the mobile computing device to perform the determined first function. In some embodiments, the received first multisensor input from at least the first touch sensor may represent a first touch movement detected on a first touch sensor of at least the first touch sensor. In some embodiments, the processing device may execute a first operation configured to cause the mobile computing device to perform a first virtual movement of an active element on the touchscreen of the mobile computing device analogous to the first touch movement. The determined first function may scale the first virtual movement relative to the first touch movement. The determined first function may scale the first virtual movement relative to the first touch movement may be based on a speed of the first touch movement.

In some embodiments, the processing device may execute a first operation configured to cause the mobile computing device to alter at least one of a background and a foreground of an image on an active display of the touch screen. In some embodiments, the processing device may execute a first operation configured to cause the mobile computing device to control a background application distinct from an active application functioning as a primary control of an active display of the touchscreen.

In block 602, the processing device may receive a second multisensor input from at least a second touch sensor (e.g., touch sensor 102, 104, 106, 108, 227 in FIGS. 1A-2). In some embodiments, the second touch sensor may be a touch sensor that is one of a plurality of touch sensors that make up the first touch sensor, and may be the same or distinct from any of the plurality of touch sensors from which the first multisensor input is received. The processing device may implement blocks 802, 804, 1002, 1004 for the received second multisensor input.

In block 1006, the processing device may determine a second function associated with the received second multisensor and the determined operational context. In some embodiments, the determined operational context may be the same or distinct from the determined operational context of associated with the determined first function.

In block 1008, the processing device may execute a second operation configured to cause the mobile computing device to perform the determined second function. In some embodiments, the received second multisensor input may represent a second touch movement detected on the second touch sensor. In some embodiments, the processing device may execute a second operation configured to cause the mobile computing device to perform a second virtual movement of the active element on the touchscreen of the mobile computing device analogous to the second touch movement and different in scale from the first virtual movement.

Figure 11:
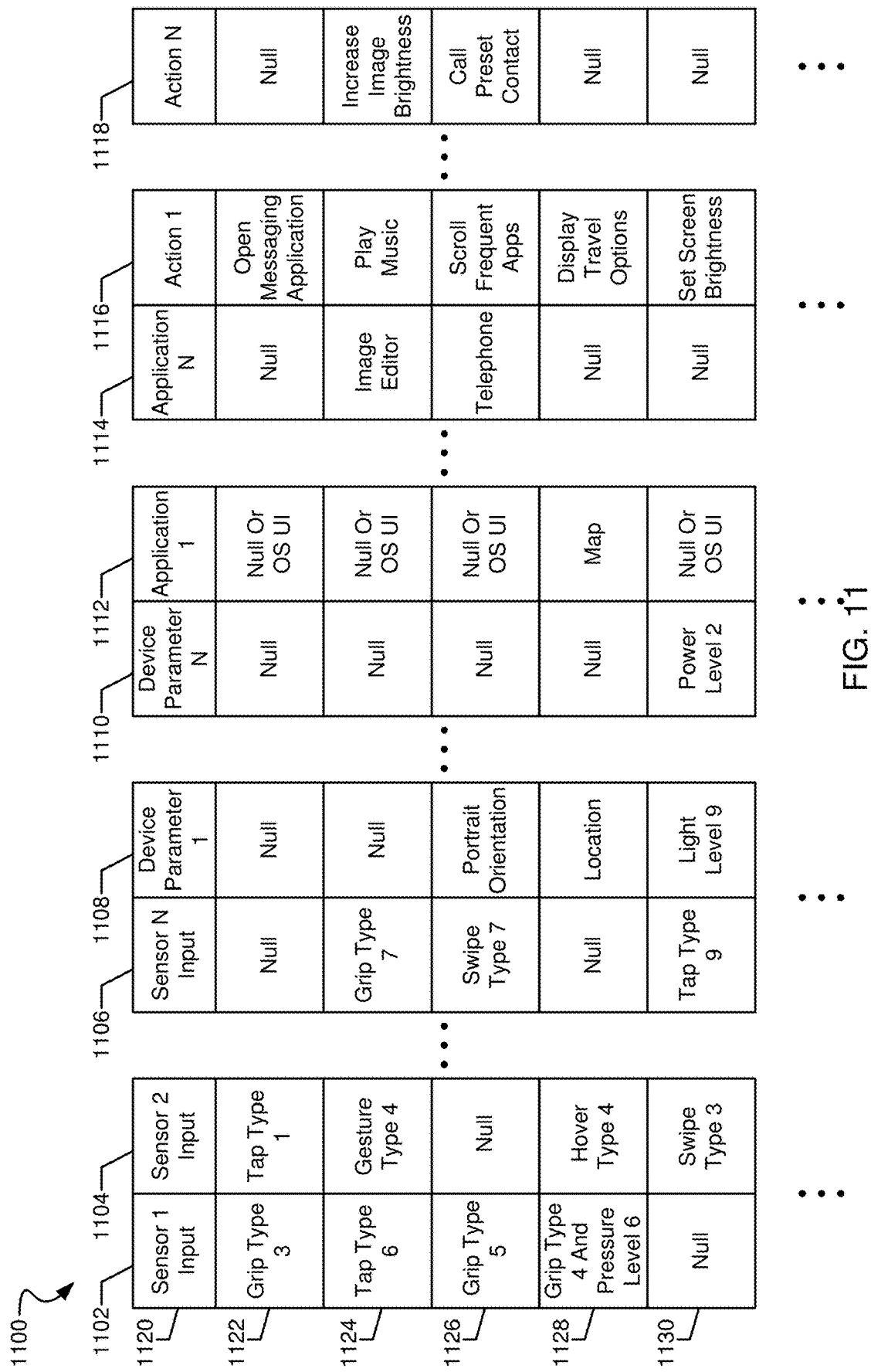
FIG. 11 is a table diagram of a multisensory input translation table for use with various embodiments.

FIG. 11 illustrates an example multisensor input translation table 1100 suitable for implementing various embodiments. FIG. 11 is provided as but one example of any number of data structures that could be used to relate various combinations of sensor inputs from front, back, side, top, and/or bottom sensors to particular actions or functionality depending upon the computing device state and/or executing applications. Further, other forms of relating various combinations of sensor inputs to particular functionality depending upon device state and executing applications may be used to implement various embodiments, such as cascaded decision trees implemented in software, hardware or a combination of software and hardware. Thus, the multisensor input translation table 1100 is intended as a non-limiting example a data structure type implementation of various embodiments.

In embodiments using a translation table implementation, a multisensor input translation table 1100 may include multiple types of data, including any number or combination of sensor inputs, device parameters, applications, and/or actions. In the example illustrated in FIG. 11, the multisensor input translation table 1100 includes a number of columns 1102, 1104, 1106, 1108, 1110, 1112, 1114, 1116, 1118 corresponding to the data types. The example data columns include: Sensor 1 Input corresponding with column 1103; Sensor 2 Input corresponding with column 1104; Sensor N Input corresponding with column 1106; Device Parameter 1 corresponding with column 1108; Device Parameter N corresponding with column 1110; Application 1 corresponding with column 1112; Application N corresponding with column 1114; Action 1 corresponding with column 1116; and Action N corresponding with column 1118. A multisensor input translation table 1100 may be configured to relate data of the various data types, including at least one sensor input from columns 1102, 1104, 1106 and at least one action from columns 1116, 1118. The relationships between the data of the various data types may be represented in the multisensor input translation table 1100 by rows 1120, 1122, 1124, 1126, 1128, 1130.

A multisensor input translation table 1100 may include data of a sensor input data type, which may be referred to as sensor input data. The sensor input data may represent interactions with a number of touch sensors (e.g., touch sensor 102, 104, 106, 108, 227 in FIGS. 1A-2). Non-limiting examples of sensor interactions that may be recognized by the various touch sensors include a grip, a tap, a press, a swipe, a gesture, a release, or a hover, and any combination of concurrent, simultaneous, or sequence of interactions with a touch sensor. The sensor input data may represent qualities of the interactions with the touch sensor, such as location, area, duration, direction, speed, pressure, number, frequency, or sequence of interactions with a touch sensor.

Each column 1102, 1104, 1106 in a multisensor input translation table 1100 corresponding to the sensor input data type may be associated with a touch sensor. The number of columns 1102, 1104, 1106 corresponding to the sensor input data type may depend on the number of touch sensors, up to N touch sensors. For example, column 1102 may correspond to a touch sensor of a back of a mobile computing device 100, column 1104 may correspond to a touch sensor of a front of a mobile computing device 100, and column 1106 may correspond to any number of touch sensors of any number of sides of a mobile computing device 100. In some embodiments, different columns may be used for the touch sensors on each side of a mobile computing device 100 (e.g., touch sensor 106).

A multisensor input translation table 1100 may include data of a device parameter data type, which may be referred to as device parameter data. The device parameter data may represent any number and combination of mobile computing device parameters other than interactions with a touch sensor. For example, device parameter data may include readings or signals from other sensors of the mobile computing device, such as a light sensor, an accelerometer, a gyroscope, a temperature sensor, a voltage and/or current sensor, an infrared sensor, etc. Device parameter data may include location data of the mobile computing device, such as global positioning system (GPS) data. Device parameter data may include wired or wireless connection data of the mobile computing device, such as cellular, Wi-Fi, Bluetooth, near-filed communication (NFC), etc., or wired peripheral device connection data, including status of a connection or identification of a device to which the mobile computing device is connected. Device parameter data may include mobile computing device state data, such as a power state (e.g., full, low, charging, specific battery charge or power level, etc.) or an activity state (e.g., active, sleep, hibernate, etc.) of the mobile computing device. Each column 1108, 1110 corresponding to the device parameter data type may be associated with device parameter data. The number of columns 1108, 1110 corresponding to the device parameter data type may depend on the number of device parameter data, up to N device parameter data. The number of device parameter data may depend on a number of device parameter data associated with a combination of sensor input data in a row 1120, 1122, 1124, 1126, 1128, 1130 of the multisensor input translation table 1100.

The multisensor input translation table 1100 may include data of an application data type, which may be referred to as application data. The application data may represent identification any number and combination of applications on the mobile computing device. Applications on the mobile computing device may include an operating system (OS) user interface (UI), applications integrated into the operating system to implement native functions of the mobile computing device, or applications loaded to the mobile computing device by an operating system developer or a mobile computing device manufacturer, distributor, seller, or user. By way of examples, applications may include a telephone application, a camera or video application, a photo gallery application, an image editing application, a media player application, a word processing application, a calendar application, a map application, a display control application, a messaging application, an email application, a game application, a home assistant application (such as, Google Home, Amazon Echo, Apple HomePod), a web browser application, a clock application, a keyboard, an alert manager application, a mobile computing device profile manager application, a privacy application, an application launcher or switcher, etc. Each column 1108, 1110 corresponding to the device parameter data type may be associated with a device parameter data. The number of columns 1112, 1114 corresponding to the application data type may depend on the number of application data, up to N application data. The number of application data may depend on a number of application data associated with a combination of sensor input data in a row 1120, 1122, 1124, 1126, 1128, 1130 of the multisensor input translation table 1100.

The multisensor input translation table 1100 may include data of an action data type, which may be referred to as action data. The action data may represent any number and combination of actions implemented on the mobile computing device in response to any combination of a combination of sensor input data, device parameter data, or application data.

The action data may include code or trigger values for, identifiers of, or references to code for implementing an action on the mobile computing device. Actions may include any number or combinations of functions of the operating system or applications on the mobile computing device. By way of examples, actions may include: taking a picture; starting, stopping, or pausing recording of a video or sound; changing a background image of an image or video; adjusting focus of an image or video at different focal lengths; adjust degree of background blur or other segmentation effects of an image or video; adjust face beautification effects of an image or video; switching between front and rear facing cameras; adjust extended reality (ER) features that can be super-imposed on an image, video, or map; adjusting other extended reality content on display such as increasing brightness of graphics in an image, video, or map; placing a bounding box on a person or object of interest in an image, video, or map; moving the selection among several people or objects in image, video, or map; selecting to show additional information on a target in image, video, or map; displaying a graphic box with information about a target image, video, or map; zooming in/out on an image, video, or map; zoom in on a specific anchor point in a map; displays a grid of thumbnail images in an image gallery or a video gallery; highlighting an image or recording in an image gallery, video gallery, or audio library; previewing an item in an image gallery, video gallery, audio library, message inbox, email inbox, contacts list, or appointments calendar; or moving forward or backward in an image gallery, video recording or video gallery, audio recording or audio library, message inbox, email inbox, contacts list, appointments calendar, or between. Extended reality may include virtual reality (VR), augmented reality (AR), mixed reality (MR), and other similar presentations of information and/or images. Extended reality refers to a range of digital output (which may include images, text, sound, tactile output, as well as output detectible with other senses) that includes wholly digital output as well as an integration of digital information with a real environment.

Further examples of actions include: turning off a ringer; toggling a silent or a vibrate mode; increasing or decreasing a ringer volume; disabling or enabling lights for alerts, turning a screen on or off; increasing or decreasing a screen brightness; reading out a current time; or shifting mode of the mobile computing device, such as putting the mobile computing device into a privacy mode where the content shown is filtered to be appropriate for others (e.g., only certain types of pictures may appear in a gallery, some texts may not appear, some applications may not appear, etc.). Further examples of actions include: answering, placing on hold, returning to, or terminating a telephone or voice over internet protocol (VOIP) call; muting or unmuting a telephone or VOIP call; or increasing or decreasing the volume of a telephone or VOIP call. Further examples of actions include mouse type actions, such as: placing a cursor, adjust a position of the cursor, trigger text selection, copying, or pasting; scrolling; or right button click type actions, such as opening deeper features/actions within an application, triggering menus. Further examples of actions include changing keyboards (e.g., from a text keyboard to a punctuation or an emoji keyboard) by toggling through or selecting different keyboards; or correcting a user's texting offsets (i.e., differences between target key and actual touch location). Further examples of actions include: automatically launching an application; bring up an application switcher; switching to a previous or next application in a stack; switching back to a current application; scrolling through the application switcher; bring a background application forward; sending an application to the background; controlling a background application; or displaying a home screen. Further examples of actions include prompting a special interface for making touches one-handed. Further examples of actions include transforming the mobile computing device into a home assistant (such as, Google Home, Amazon Echo, Apple HomePod). Further examples of actions include moving the mobile computing device into a state of readiness to interpret sensor input data or device parameter data as distinct commands. Further examples of actions include controlling interaction with a connected computing device, such as showing or hiding, moving, etc. extended reality content. Further examples of actions include increasing or decreasing the sensitivity of the touch sensors.

Each column 1108, 1110 corresponding to the device parameter data type may be associated with a device parameter data. The number of columns 1116, 1118 corresponding to the action data type may depend on the number of action data, up to N action data. The number of action data may depend on a number of application data or device parameter data associated with a combination of sensor input data in a row 1120, 1122, 1124, 1126, 1128, 1130 of the multisensor input translation table 1100.

Rows 1120, 1122, 1124, 1126, 1128, 1130 of the multisensor input translation table 1100 may associate data of the columns 1102, 1104, 1106, 1108, 1110, 1112, 1114, 1116, 1118. A processor (e.g., general-purpose processor 206 of FIG. 2) may access a row 1120, 1122, 1124, 1126, 1128, 1130 of the multisensor input translation table 1100 having a combination of sensor input data in a combination of columns 1102, 1104, 1106 corresponding to sensor input data received by the mobile computing device via a combination of touch sensors. The processor may determine an action to execute from the action data in a column 1116, 1118 of the row 1120, 1122, 1124, 1126, 1128, 1130 based on any combination of the device parameter data, the application data, or the action data in any combination of columns 1108, 1110, 1112, 1114, 1116, 1118 of the row 1120, 1122, 1124, 1126, 1128, 1130.

In some embodiments, the application data associated with a combination of sensor input data in a row 1120, 1122, 1124, 1126, 1128, 1130 of a multisensor input translation table 1100 may be augmented with additional columns 1112, 1114 or overwritten. For example, a running application may be associated with an action in response to a combination of sensor input data. The application data for the running application may be added to a row 1120, 1122, 1124, 1126, 1128, 1130 of the multisensor input translation table 1100 having the combination of sensor input data by adding a column 1112, 1114. In another example, a running application may preempt action in response to a combination of sensor input data for other applications, and the combination of sensor input data in a row 1120, 1122, 1124, 1126, 1128, 1130 of the multisensor input translation table 1100 may be associated with the running application; and disassociated with another application by overwriting the application data of the other application with the application data of the running application. In other words, a running application may preempt action in response to a combination of sensor input data for another application with application data in the multisensor input translation table 1100 by replacing the application data for the other application in the multisensor input translation table 1100 with application data for the running application.

In some embodiments, the device parameter data or the action data associated with a combination of sensor input data in a row 1120, 1122, 1124, 1126, 1128, 1130 of the multisensor input translation table 1100 may be expanded with additional columns 1108, 1110, 1116, 1118 or overwritten based on the application data in the row 1120, 1122, 1124, 1126, 1128, 1130. Similar to the application data addition examples, the device parameter data or the action data associated may be associated with a combination of sensor input data and an application data in a row 1120, 1122, 1124, 1126, 1128, 1130 of the multisensor input translation table 1100. The device parameter data or the action data associated with a running application may be added to a row 1120, 1122, 1124, 1126, 1128, 1130 of the multisensor input translation table 1100 having the combination of sensor input data and the application data by adding a column 1108, 1110, 1116, 1118.

In embodiments in which the running application preempts action for other applications, the device parameter data or the action data for the running application may be associated with the combination of sensor input data and running application data in a row 1120, 1122, 1124, 1126, 1128, 1130; and the device parameter data or the action data for the other application may be disassociated from the combination of sensor input data and running application data in a row 1120, 1122, 1124, 1126, 1128, 1130 by overwriting the device parameter data or the action data with the device parameter data or the action data of the running application.

In various embodiments, new application data, device parameter data, or action data associated with a combination of sensor input data in a row 1120, 1122, 1124, 1126, 1128, 1130, already containing application data, device parameter data, or action data, may be added to the multisensor input translation table 1100 by adding a new row associating the combination of sensor input data with the new application data, device parameter data, or action data. In some embodiments, multiple multisensor input translation tables 1100 may be implemented for various inputs from combinations of touch sensors, sets of device parameters, applications, or sets of actions. In some embodiments, the multisensor input translation table 1100 may be stored on, loaded to, or accessed from a memory (e.g., memory 214 of FIG. 2) of the mobile computing device by the processor, such memory including a non-volatile storage memory, a volatile main memory, such as a random access memory (RAM), and/or a volatile cache memory.

Figure 12:
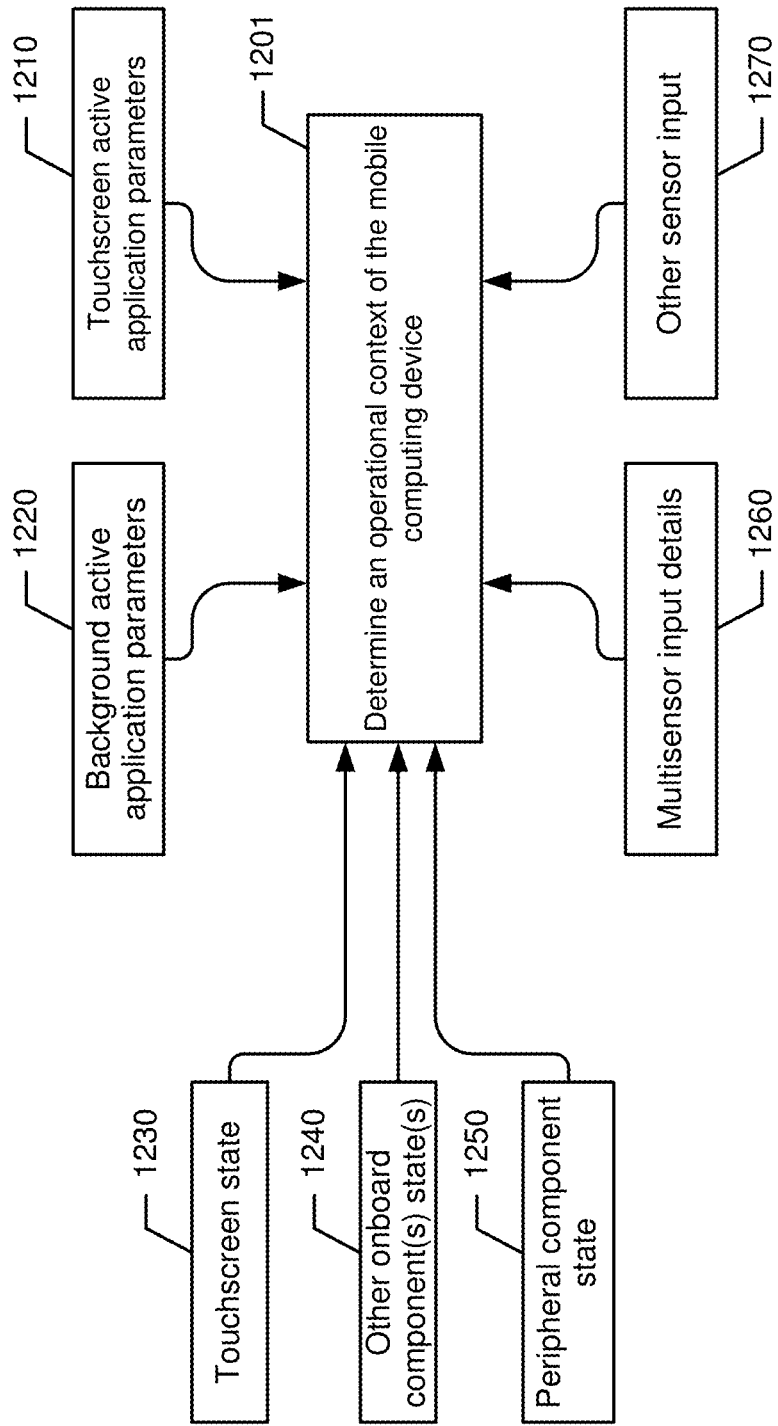
FIG. 12 is a schematic block diagram of an inference engine receiving input from various sources that is suitable for implementing various embodiments.

In various embodiments, an operational context of the mobile computing device may be determined using contextual awareness data. A processor may consider the received multisensor inputs in the determined operational context to determine a particular function to execute. An example of determining an operational context of the mobile computing device using contextual awareness data is shown in FIG. 12. The operational context of the mobile computing device may be determined by combining or fusing, by an inference engine 1201, a plurality of data associated with received inputs, parameters from one or more active applications, and/or state information from one or more components associated with the mobile communication device, such as a multitude of different types of data relevant to conditions under which multisensor inputs are received. In some embodiments, the inference engine 1201 can combine or fuse both real-time and non-real time contextual awareness data associated with conditions under which multisensor inputs are received in order to determine the operational context.

Contextual awareness data may include any suitable type of real-time and/or non-real-time data associated with the mobile computing device, such as, for instance, touchscreen active application parameters 1210, background active application parameters 1220, a touchscreen state 1230, other onboard component(s) state(s) 1240, a peripheral component state 1250, multisensor input details 1260, other sensor inputs 1270, and any other suitable contextual awareness data, and/or any combination thereof. The touchscreen active application parameters 1210 may include a list of available or currently permissible inputs for an application actively controlling all or part of a display on the touchscreen that may be received as a multisensor input. For example, while reading an email (i.e., an active application), if the user turns the mobile computing device sideways and grasps it with two thumbs on the front and supports it on the back, then the touchscreen may immediately change to a landscape keyboard and provide the user interface for receiving inputs that may be used to reply to that email. As another example, front and back touches may be used to complement each other's slightly different affordances. For example, in a text message, a user tapping on the touchscreen may place a cursor at a certain word display where the user tapped. The user may then touch a back surface of the mobile computing device to more finely position the cursor between words or letters. This exploits the relative advantages of each side: Using combinations of front and side touch inputs may be useful to allow a user to find the touch target and then touch it directly. Back touch may enable the user to move a selector or cursor in a fine-grained manner without the finger on the front being in the way.

Similarly, with a photo gallery application active, a swipe rearward facing touch sensor may move a highlighted frame among a grid of pictures. Thereafter, a tap gesture may select or show a context menu.

The background active application parameters 1220 may include a list of available or currently permissible inputs for an application actively running on the mobile computing device, but not actively controlling all or part of a display on the touchscreen that may be received as a multisensor input.

The touchscreen state 1230 may provide information regarding whether the touchscreen is on, off, dimmed, or in some other state. For example, with the touchscreen in an off state, received multisensor inputs may be intended for a particular background application. Similarly, other onboard component(s) state(s) 1230, like the remaining charge in a battery of the mobile computing device or whether the mobile computing device is in a power conservation mode, may provide information regarding whether multisensor inputs should be ignored or whether touch sensors, other than the touchscreen, should be turned off.

The peripheral component state 1250 may provide information regarding whether multisensor inputs may be intended to control that peripheral component. For example, if extended reality goggles or an audio headset are operatively coupled to the mobile computing device, received multisensor inputs may be used to control such peripheral components.

The multisensor input details 1260 may include the touch profile associated with the multisensor input and identify which touch sensor(s) or which part of one or more particular touch sensors detected the change in touch sensor state.

The other sensor input 1270 may provide information from other sensors of the mobile communication device that may be used for determining an operational context of the mobile computing device. For example, proximity, orientation, and/or motion sensors may be used to recognize the mobile computing device is face down on a surface, in a pocket, moving, stationary, or in some other situation that may inform a current operational context of the mobile computing device.

In some embodiments, in addition to using contextual awareness data, the inference engine 1201 may use relevant data (e.g., real-time, non-real time, or a combination thereof) that are not only associated with multisensor inputs or determining the operational context. For example, the inference engine 1201 may use real time of day, date, location, and other similar information that may be helpful for determining a current operational context of the mobile computing device.

All this information may be used by an inference engine 1201 to determine a current operational context. For example, inference engine 1201 can generate a contextual assessment corresponding to the determined operational context. The contextual assessment may then be used to determine what to do with received multisensor inputs.

In some embodiments, the inference engine 1201 may utilize a state machine (e.g., deterministic rule based and/or a statistical state machine) to analyze data, e.g., data from available resources such as 1210, 1220, 1230, 1240, 1250, 1260, 1270 and infer decisions on the operational context. The rule base and the statistical state machine of the inference engine 1201 may be trained off line, on-line, or partly off-line and on-line. In addition, the inference engine 1201 may also exchange information with a knowledge support system or other remote data source, in determining the operational context.

Figure 13:
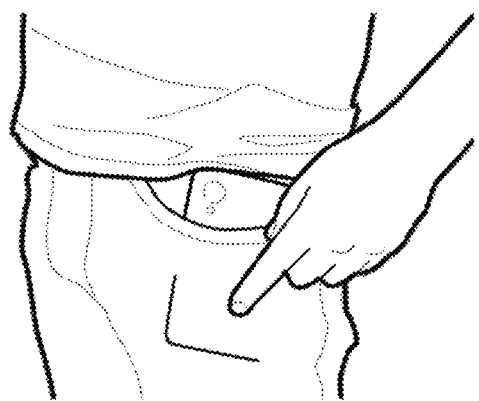
FIG. 13 is a schematic diagram of a user carrying the mobile computing device in a front pant pocket suitable for implementing various embodiments.
Figure 14A:
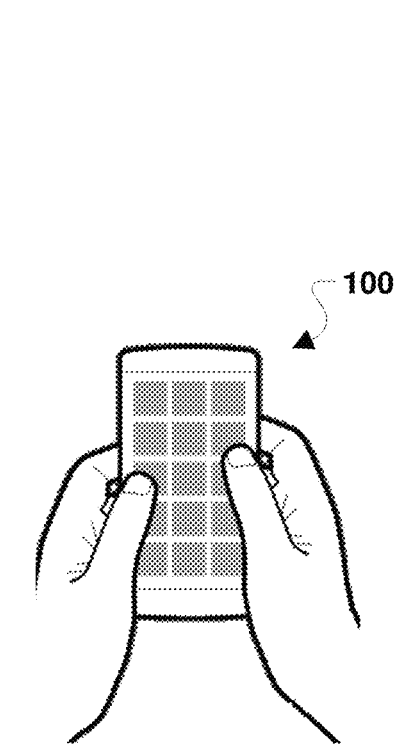
FIGS. 14A-14D are schematic diagrams of various ways a user may grip a mobile computing device that may be detected using touch sensors.
Figure 14B:
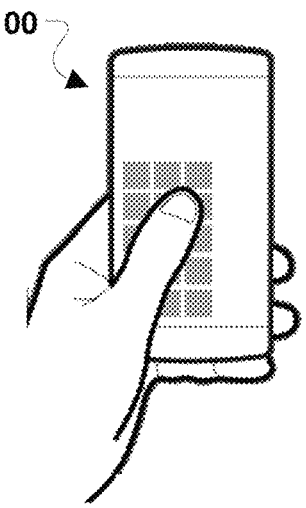
Figure 14C:
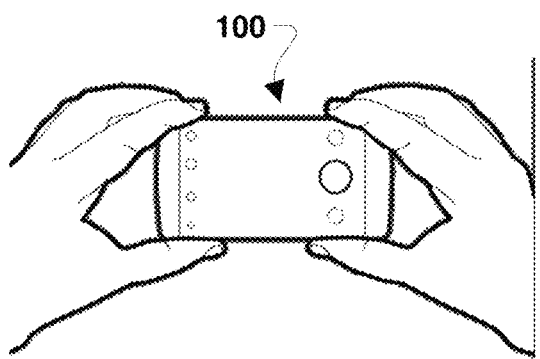
Figure 14D:
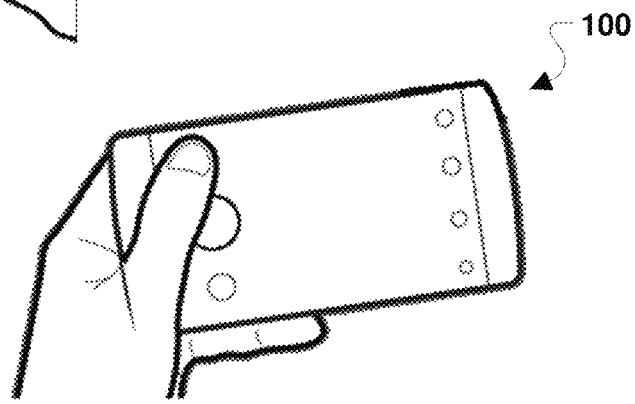

FIGS. 13-14D illustrate some examples of contextual awareness data being used to change an operating mode and/or setting of the mobile computing device 100 in accordance with various embodiments.

FIG. 13 illustrates a user carrying the mobile computing device in a front pants pocket. In various embodiments, the processor of the mobile computing device may use contextual awareness data, such as input from sensors of the mobile computing device, to determine an operational context. For example, the processor may determine whether other sensor inputs (e.g., 970 in FIG. 9) indicate the mobile computing device is in a put-away state (i.e., an operational context). One or more of the outputs of the other sensors may be compared to one or more thresholds, singularly or in combination, and the one or more of the outputs being above or below the thresholds may indicate the mobile computing device is in a put-away state. As a specific example, a camera sensing a threshold level of darkness for a period time while accelerometer movements are detected may indicate the mobile computing device is in a closed bag or pocket. As another specific example, a microphone output being consistent with the shuffling and muffling sounds typical in a pocket or bag may indicate the mobile computing device is in a pocket or bag.

In some embodiments, the processor of the mobile computing device may be configured to learned various user-designated put-away states, such as through a calibration or registration process in which the user places the mobile computing device in a particular put-away state long enough to enable the processor to gather various sensor data to be correlated to the particular put-away state. Such sensor data may be stored in memory and subsequently used as thresholds for determining when the mobile computing device is in a put-away state.

In response to determining the mobile computing device is in a put-away state, the processor may boost the capacitance of the touch sensors, increasing the likelihood that the touch sensors will detect touch input from a user's finger through the material of the pants or other obstructing elements.

FIGS. 14A-14D illustrate various ways to grip a mobile computing device that may be detected using touch sensors. In various embodiments, a particular type of grip or mobile computing device orientation may be used as contextual awareness data for determining an operational context.

FIG. 14A illustrates a two-handed grip. This two-handed grip may be detected from a touch profile that is consistent with both palms engaging opposed lateral sides of the mobile computing device 100, while fingers are held against a back of the mobile computing device.

FIG. 14B illustrates a one-handed grip, which may be detected from a touch profile that is consistent with only one palm engaging a lateral side of the mobile computing device 100, while fingers extending from that palm are held against a back of the mobile computing device 100.

FIG. 14C illustrates another two-handed grip, with the mobile computing device 100 held sideways. This two-handed grip with landscape orientation may be detected from a touch profile characterized by fingers holding three or more corners of the mobile computing device 100.

FIG. 14D illustrates another one-handed grip, with the mobile computing device 100 held sideways. This one-handed grip with landscape orientation may be detected from a touch profile consistent with only one palm engaging a bottom or top side of the mobile computing device 100, while fingers extending from that palm are held against a back of the mobile computing device.

FIGS. 15-18 illustrate some examples of various gestures that may be detected as a multisensor input and used to cause the mobile computing device (e.g., mobile computing device 100 in FIGS. 1A and 1B) to perform a predetermined function in accordance with various embodiments.

Figure 15:
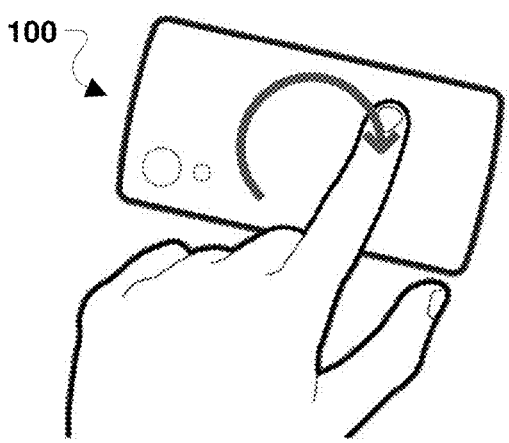
FIG. 15 is a schematic diagram of a user making a gesture that may cause the mobile computing device to perform a predetermined function in accordance with various embodiments.

FIG. 15 illustrates a plan view of a user performing a circle gesture on a back of a mobile computing device. A gesture, like a circle or arch shaped gesture, on the back of the mobile computing device may provide a way of launching an application of the mobile computing device, like an audio recording. A user may draw a circle type shape with a finger or stylus to begin recording. Use of this type of gesture may be useful to record classroom lectures, business meetings, and social events. This gesture is also discrete and unobtrusive. Also, other subsequent gestures, like a tap, may be used to toggle between record and pause. Similarly, subsequently drawing a square on the back of the mobile computing device may stop recording. The mobile computing device may vibrate, or provide other visual or haptic signal, to let the user know that recording has started, paused, or stopped. Also, the mobile computing device may vibrate twice when recording is paused or stopped.

Figure 16A:
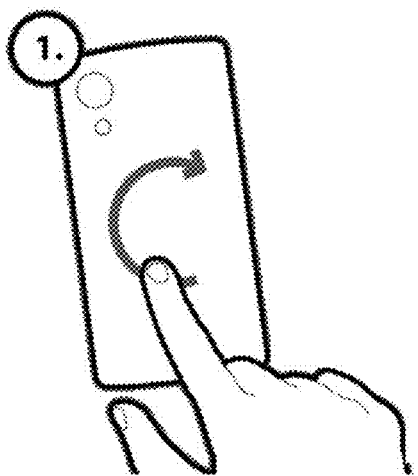
FIGS. 16A and 16B are schematic diagrams of a user making a gesture that may cause the mobile computing device to perform a predetermined function in accordance with various embodiments.
Figure 16B:
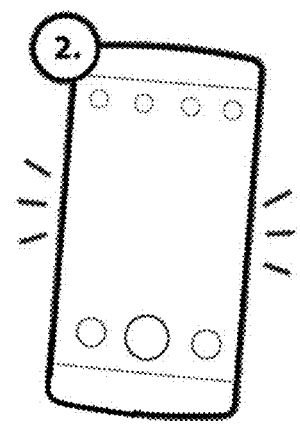

FIGS. 16A and 16B illustrates a plan view of a user performing another circle gesture on a back of a mobile computing device for launching an application. For example, while the user has an internet browser application active on the display of the touchscreen, the user may jump directly to another application, like the camera by using a predetermined gesture. The letter may be associated with a name of the application, like drawing a "C" for the camera application to launch. Alternatively or additionally, the user may perform an intermediate gesture (i.e., a "trigger" gesture) on the back of the device, which when recognized, makes available one or more shortcut gestures for launching an app. In various embodiments, a trigger gesture may only last a short period, like a few seconds, after which the shortcut gestures are no longer available.

Figure 17:
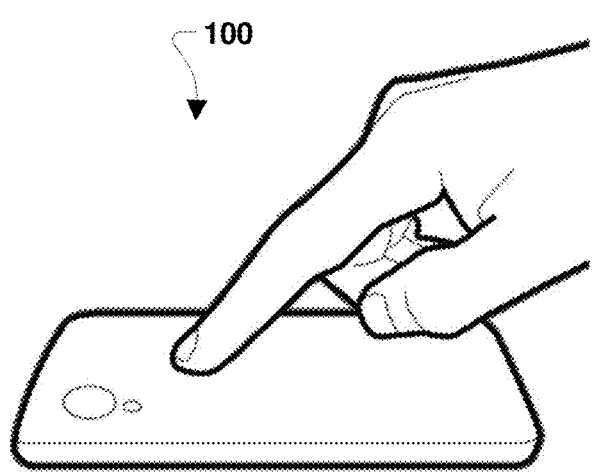
FIG. 17 is a schematic diagram of a user making a gesture that may cause the mobile computing device to perform a predetermined function in accordance with various embodiments.

FIG. 17 illustrates a side perspective view of a user performing a tap or other gesture on a back of a mobile computing device to control an application that is active but not displaying on the touchscreen. When a music player application is active (i.e., playing), and the mobile computing device is face down on a surface, the display may shut-down to conserve battery. In some embodiments, a user may control the music player application using one or more gestures on the back of the mobile computing device. For example, a tap may toggle between play and pause; swiping left and/or right may change to the next or previous song; swiping up and/or down may change volume, etc. In this way, the display does not have to be activated to control the application (i.e., provide music controls).

Figure 18:
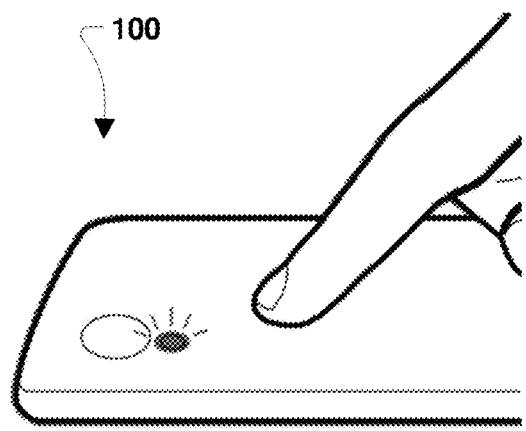
FIG. 18 is a schematic diagram of a user making a gesture that may cause the mobile computing device to perform a predetermined function in accordance with various embodiments.

FIG. 18 illustrates a side perspective view of a user resting a finger (i.e., a non-moving gesture) on a back of a mobile computing device to control an application that is not active. A resting finger, tap, or other gesture may be used to launch another application, like the voice assistant. A processor may use an indicator, like the Flashlight application on the back of the mobile computing device (or color LED light), by making it flash, to show that the voice assistant is listening. Thereafter, the user may ask the voice assistant questions or give commands, like, "What's the weather;" "Call David; "When is my next meeting?;" and "Play my Miles Davis Playlist."

Various embodiments may use additional gestures or combination of touches to activate features or functions on the mobile computing device. The following lists provides some examples of applications that primarily use the back/side only to provide unique but useful touch interactions:

- Squeeze the edges for actions like triggers, captures, and selection. For example, squeeze to take a picture or send a message or content.
- Swipe down to zoom in (i.e. pull the content closer to the user) and vice versa
- From the back of the phone, highlight the "beautify" icon on the front display, and drag the icon into the viewfinder to apply the effect. Similar actions for other camera effects."
- Swipe down to decrease loudness level and brightness, and vice versa
- Swipe horizontally to change out background images (see other examples in original document on this topic)
- Coordinating side and back touches: When scrolling text or in text entry, the left/right side panels could move the cursor up/down, consistent with the direction of the finger. But back scrolling (even if at an angle) will move down page by page (or horizontally).
- While in 2-handed holding position (such as entering text), swipe down on the sides to switch text entry keyboards.
- Grip position and hand (left or right) to launch 1-handed mode, which can either be on the left or the right (depending on which hand invoked it) and can be sized according to the size of the hand that invoked it and can be positioned vertically on the display according to where the user gripped (a high grip would position the 1-handed mode to make it easier to reach low; a low grip would position the 1-handed mode to make it easier to reach high).
- When there are multiple applications running, tapping on the back of device can surface an app up to the foreground: this is a natural way of pushing content forward and can apply to music tracks in a playlist and images in a gallery folder. User can continue to tap on the back to bring the next app in the stack to the foreground. Tapping on the front while in the app switcher could do the opposite (push the top app into the background)
- Home key replacement: tap on the back to simulate a home key so that the physical home key can be removed. This could be a special kind of tap to differentiate from false triggers (e.g., strong-tap, double tap, two-finger tap, two-finger time sequenced tap).
- Swipe on the back/side to move highlighted frame among a grid of pictures, then tap to select or show a context menu. Optionally, press-and-hold the highlighted item from the back to open the item, or to present a context menu. An item on the context menu can be selected from the front.
- Map a smaller scrollable space on the back of device to a larger region on the front of the display. This region can be sized based on the size of the hand and reach of the finger.

FIGS. 19A-27B illustrate some examples of additional gestures that may be used to cause the mobile computing device (e.g., mobile computing device 100 in FIGS. 1A and 1B) to perform a predetermined function, in accordance with various embodiments. By providing and using touch sensors on one or more surfaces of the mobile computing device, other than the front where the touchscreen is disposed, a display on the touchscreen may remain unobstructed or less occluded by the user's fingers or hand(s).

Figure 19A:
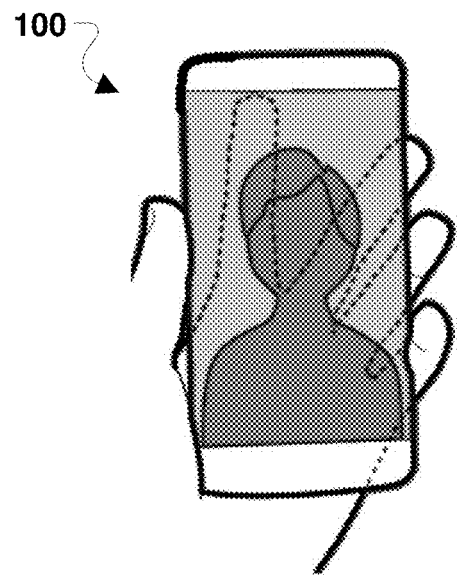
FIGS. 19A and 19B are schematic diagrams of a mobile computing device held by a user in one hand while performing a gesture on a back surface of the mobile computing device with a finger of that hand.
Figure 19B:
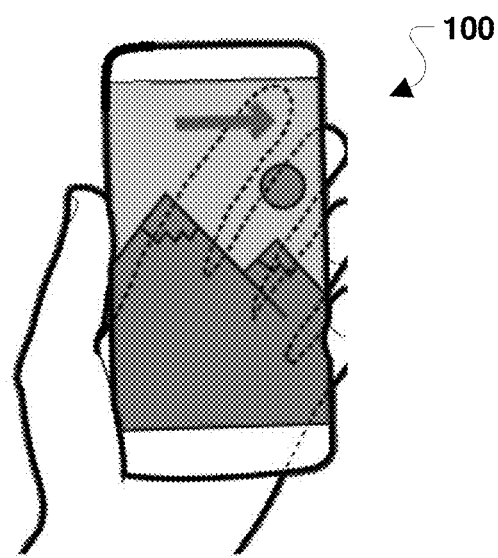

FIGS. 19A and 19B illustrate a mobile computing device held by a user in one hand while performing a gesture on a back surface of the mobile computing device with a finger of that hand. In FIGS. 19A and 19B, the photo gallery is an active application displaying pictures on the touchscreen. The one-handed grip of the user and the photo gallery application active on the mobile computing device may define the operational context associated with those conditions. In FIG. 19A, the user, while holding the mobile computing device in one hand (i.e., a left hand) engages an index finger on a back panel of the mobile computing device. Thereafter, by sliding the index finger to the right (in the orientation shown in FIGS. 19A and 19B) along the back panel, the picture displayed from the photo gallery changes. Based on the determined operational context, a particular multisensor translation table may be used to convert characteristics of the sliding motion against the back panel to the operation of changing photographs in the photo gallery. In this way, the pictures remain unobstructed while browsing through the photo gallery. In addition or optionally, using gestures or contact with the touchscreen may move between images, while using gestures or contact on the back panel provides a different function, like zooming-in on a photo.

Figure 20A:
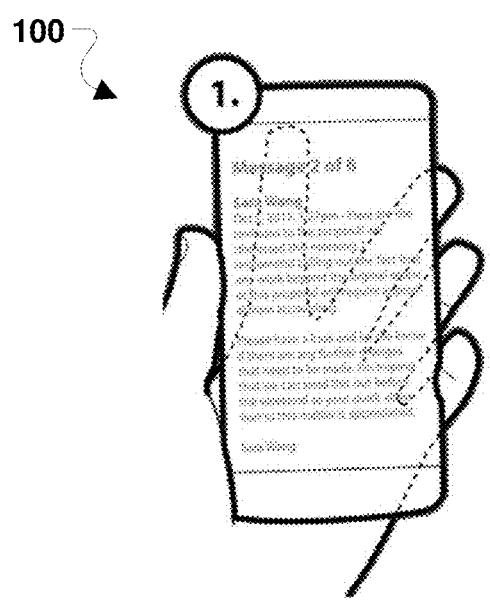
FIGS. 20A and 20B are schematic diagrams of a mobile computing device held by a user in one hand while the user performs a gesture on a back surface of the mobile computing device with a finger of that hand.
Figure 20B:
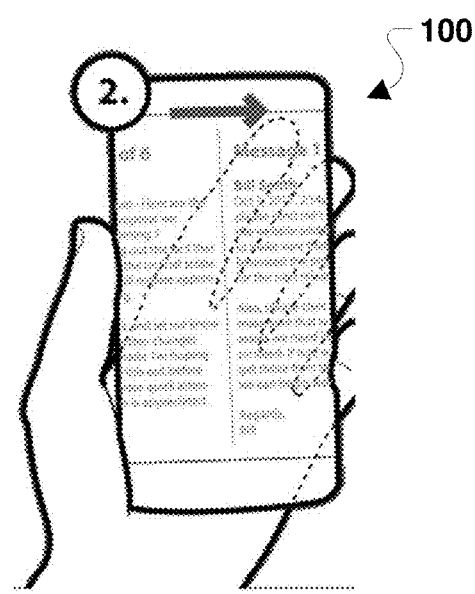

FIGS. 20A and 20B illustrate a mobile computing device held by a user in one hand while performing a gesture on a back surface of the mobile computing device with a finger of that hand. In accordance with various embodiments, by providing and using touch sensors on one or more surfaces of the mobile computing device, other than the front where the touchscreen is disposed, a display on the touchscreen may remain unobstructed or less occluded by the user's fingers or hand(s). In FIGS. 20A and 20B, an e-mail application is the active application displaying text on the touchscreen. The one-handed grip of the user and the e-mail application active on the mobile computing device may define the operational context associated with those conditions. In FIG. 20A, the user, while holding the mobile computing device in one hand (i.e., a left hand) engages an index finger on a back panel of the mobile computing device. Thereafter, by sliding the index finger to the right (in the orientation shown in FIGS. 20A and 20B) along the back panel, the e-mail displayed advances to another e-mail. Based on the determined operational context, a particular multisensor translation table may be used to convert characteristics of the sliding motion against the back panel to the operation of changing from one e-mail to another. In this way, the text of each e-mail remains unobstructed while browsing through e-mails. Similarly, with other applications, like a calendar, swiping left and/or right on the back panel of the mobile computing device may move to the next/previous day, month, or year. In addition, swiping down on the back panel may access other features, like the Android notification drawer or IOS notifications list. The swipe on the back panel need not start at the top of the mobile computing device, like the top of the touchscreen, which may be hard to reach when holding the device one-handed.

FIGS. 21A and 21B illustrates a user holding the mobile computing device one-handed while tapping a back panel to active a function of an active application. For example, a tap on back panel may take a picture. Alternatively, another gesture, like a squeeze or pinch gesture may take the picture. Swiping in a direction may zoom in/out, allowing one-handed camera use, which is a major advantage. In addition, swipe gestures may be used to adjust focus at different focal lengths, adjust degree of background blur or other segmentation effects, add or adjust face beautification effects, and/or change out a background image.

FIGS. 22A and 22B illustrates a user performing a tap gesture on a back of a mobile computing device to active a function of another active application. While viewing thumbnails in the photo gallery, a user may position an index finger behind a particular thumbnail and tap on the back panel, which may pop the thumbnail forward, or make it stand out, like enlarged relative to other thumbnails. Alternatively, an initial touch on the back panel may highlight a corresponding thumbnail or otherwise provide users with a visual indication of where their finger is on the back panel before they tap to enlarge or bring the thumbnail forward. Optionally, holding the finger at that location may trigger an advanced options menu for that picture to be presented. User may select one of the options with a front touch. The same principal may be used to "preview" a video or other content. The user may open the previewed video by selecting it using a front finger (e.g., the thumb) to touch the touchscreen.

FIGS. 23A and 23B illustrates a user performing a tap gesture on a back of a mobile computing device to active yet another function of another active application. The user may place the index finger behind an email message (i.e., on the back panel), press and hold from the back, and an options menu for that message may pop up. User may select one of the options using the front finger. A similar feature may be provided for a contact on the contact list, or a song from the music player.

Figures 24A, 24B:
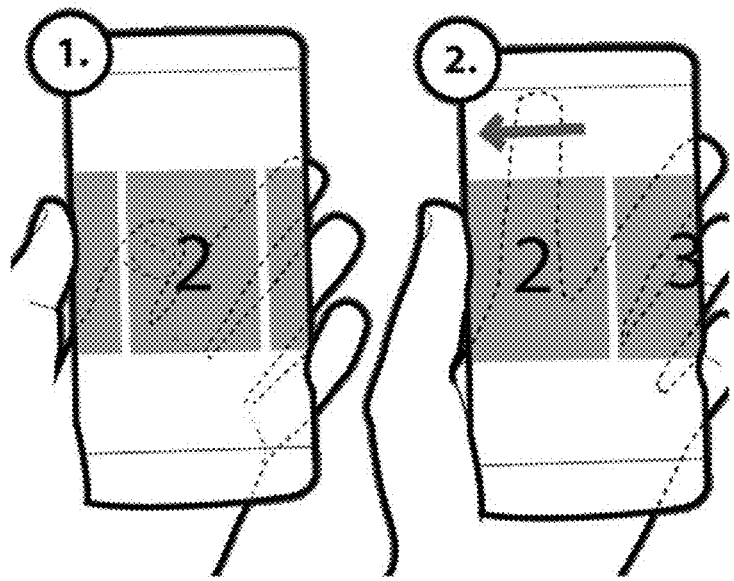
FIGS. 24A and 24B are plan views of a user performing a tap gesture on a back of a mobile computing device to active general functions of the mobile computing device.

FIGS. 24A and 24B illustrates a user performing a tap gesture on a back of a mobile computing device to active general functions of the mobile computing device. For example, on mobile computing devices without a "Home key," a simple unique tap on the back panel may activate the Home screen of the device. Similarly, a simple unique tap on the back may bring up a task switcher menu, which may allow the user to scroll between applications using back swipes. Also, a simple unique tap on the back may capture a selfie or regular photo.

Figures 25A, 25B:
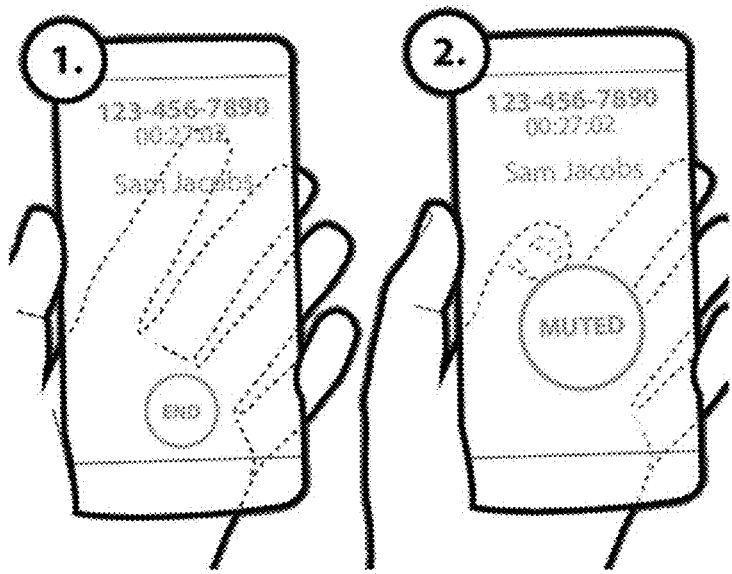
FIGS. 25A and 25B are plan views of a user performing a tap gesture on a back of a mobile computing device to active general functions of the mobile computing device.

FIGS. 25A and 25B illustrates a user performing a tap gesture on a back of a mobile computing device to active functions of an active application on the mobile computing device. For example, call features, like a simple unique tap on the back may Mute/Un-mute a call or switch calls. An up/down swipe on the back may increase/lower the volume. A single finger up/down swipe on the back may scroll through content (or menus) at a normal speed, while a two finger up/down swipe may advance more quickly. A unique tap followed by a downward swipe from the top (or at least in a downward direction) may pull down a notification tray/list.

Figures 26A, 26B:
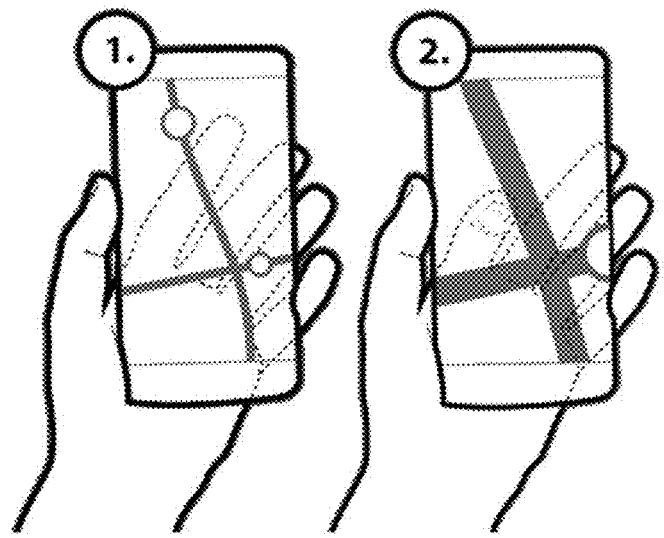
FIGS. 26A and 26B are plan views of a user performing a tap gesture on a back of a mobile computing device to active functions of an active application on the mobile computing device.

FIGS. 26A and 26B illustrates a user performing a tap gesture on a back of a mobile computing device to active functions of an active application on the mobile computing device. While a map application is active, a touch point on the map with thumb on the display of the mobile computing device, to provide an anchor point. Then, a swipe with index finger on the back panel may zoom in and/or out of the anchor point. Similarly, a gallery zoom function may be provided for zooming in and out on images in the Gallery.

Figures 27A, 27B:
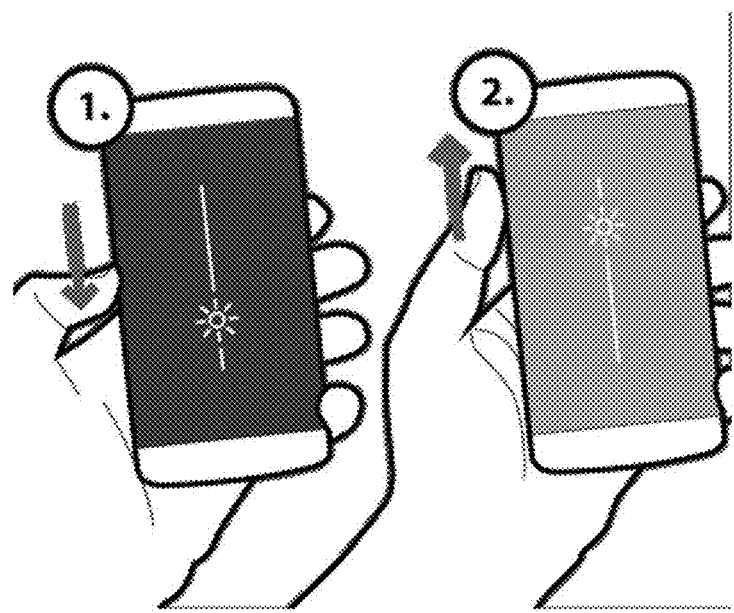
FIGS. 27A and 27B are plan views of a user performing another gesture on a side panel of a mobile computing device to control application features or general functions of the mobile computing device.

FIGS. 27A and 27B illustrates a user performing another gesture on a side panel of a mobile computing device to control application features or general functions of the mobile computing device. For example, when the display on the touchscreen turns off, the luminance may be recorded. When the touchscreen turns on again, the processor may check for a big change in luminance. If a big change is detected, then the mobile computing device may allow the user to adjust brightness by sliding the finger up and down the side. The mobile computing device may support this type of control for a brief period, like a few minutes, when the display has turned back on.

FIGS. 28A-30B illustrate some examples of combination gestures, touching the front and back/side surfaces to cause the mobile computing device (e.g., mobile computing device 100 in FIGS. 1A and 1B) to perform a predetermined function, in accordance with various embodiments. Various embodiments use back and side inputs in coordination with front inputs to result in device actions. Specifically, combinations of touches (to different parts of the device) may constrain the meaning of the touch. This may include both simultaneous use of inputs to the front versus sides/back of the mobile computing device and sequential use of inputs to the front versus sides/back of the mobile computing device, wherein the behaviors of the mobile computing device are dependent upon these combinations of touches.

Various embodiments may include configurations in which an interaction on the back panel or sides of the device serves as a persistent "mode changer," such that while that touch is happening on the back of the device, the behaviors of the phone that occur as a result of certain (or all) touch types to the front of the phone are altered from their usual response. For example:

Only while two fingers are placed flat on the back of the screen adjacent and touching one another laterally can strong taps to the front of the device be interpreted as an intent to launch into a deeper functionality within an app.

Only while two fingers are placed flat on the back of the screen adjacent and touching one another laterally can active gestures (e.g., swiping in the shape of a "C") to the front of the device be interpreted as triggers for special features (e.g., shortcuts to launching an app such as contacts) rather than as regular swipes.

Only while two fingers are placed flat on the back of the screen adjacent and touching one another laterally will the device be in a privacy mode. In this mode, private apps are hidden from view, content from specific users can be hidden and pictures of certain categories are hidden. For example, while in this privacy mode (as a result of the persistent touching style to the back of the device), a touch to the gallery icon would result in a different appearance of thumbnails than would otherwise occur (because the images will be screened in privacy mode).

Various embodiments may include configurations where an interaction on the back panel (or sides of the device) serves as "mode changer" for some temporary period of time. This period of time could be until a particular touch is performed on the front of the device or it could be for a pre-specified time period. For example:

A strong tap to the back of the phone could result in a thumbnail style picture of all the open apps. Subsequently, the user could select any apps they want to close by touching them. A strong tap to the front of the device could then result in leaving this deletion mode (with only the unselected apps left open in the stack) and the screen returning to a full screen view of the strong-tapped app. In this case the strong tap to the front of the screen ended the mode that was brought about by a strong tap to the back of the screen.

A strong tap to the back of the device puts the phone into a temporary mode where it silences all alerts and calls until your GPS position moves above some threshold. Until your phone moves to a different region (as determined by GPS motion) or until the phone back is tapped again, it will continue to silence all alerts and calls. This could be useful for silencing one's phone just for a meeting or just while at a movie without having to remember to turn it back up later.

A strong tap to the back of the device triggers the phone to monitor for active gestures to the front of the phone for 10 seconds. For example, after strong tapping the back of the phone, the user could then swipe in an arc and then a line toward the hand to trigger the flashlight to come on. This gesture to the front of the phone would not trigger the flashlight under normal circumstances—only when the strong tap has recently been received from the front of the device. If no gesture is received within the 10 second window after the strong tap, then the device stops monitoring for this (or any other) special gesture.

A strong tap to the front of the device leads a cursor to appear, and now the user can control the position of the cursor using finger movements on the back of the device.

Various embodiments may include configurations in which simultaneous (or near simultaneous) touches to any combination of front/back and sides creates a specific reaction from the device that is different than the response to any of the component touches alone. For example:

Holding the phone with two fingers flat on the back of the screen and touching one another laterally and with the thumb flat on the front of the device could trigger a one-handed mode.

Holding the phone with the thumb across the front of the screen and with the index finger balled up against the back of device could trigger the screen to split so that two apps can be utilized at once.

The various embodiments above may also include aspects that provide a different context for interpretation of that combined touch indications. For example:

While reading an email, if the user turns the mobile computing device sideways and grasps it with two thumbs on the front and supports it on the back, then the screen may immediately change to a landscape keyboard and the user interface may replying to that email.

Using front and back touches to complement each other's slightly different affordances. For example, while creating a text entry, the user may tap on the front of the display to place the cursor at a certain word. Back touch is then used for finely positioning the cursor between two letters within that word. This exploits the relative advantages of each side that the front side touch is useful as it allows the user to find the touch target and then touch it directly. The back touch allows the user to move a selector or cursor in a fine-grained manner without the finger on the front being in the way.

While the photo gallery application is active, a swipe on the back panel may move a highlighted frame among a grid of pictures, then a tap may select or show a context menu.

FIGS. 28A and 28B illustrates a user performing a combination of gestures, one on the back panel and another on the touchscreen of the mobile computing device to perform certain functions, like text selection for copy/past or precision cursor adjustment. A user may make an initial selection on the front of the screen with a finger tap, then slide another finger on the back panel (or the sides) to adjust the final selection. The back touch may allow the user to move the cursor in a fine-grained manner without the front finger obstructing the user's view. Alternatively, a touch on the touchscreen may initially place the cursor, then use of the back panel may act like a mouse pad function that supports smaller scale cursor movements. In various embodiments, a smaller scrollable space on the back of the device to correspond to a larger region of movement on the front (i.e., scaled movement). Such scaled movement may improve one-handed reach of features on the mobile computing device.

FIGS. 29A and 29B illustrates a user performing another combination of gestures, one on the back panel and another on the touchscreen of the mobile computing device to perform certain functions. For example, a strong tap on the back panel may be used to copy selected text, then a strong tap on the front of the screen may paste the copied text. Alternatively, two-handed text entry gestures may include swipe down on the sides to switch text entry keyboards; tap both thumbs on the side of the phone to toggle between an emojis list and a keypad/keyboard; or tap both thumbs along the side, and the height of the tap will determine the emoji keypad that is brought to the foreground.

FIGS. 30A and 30B illustrates a user performing another combination of gestures, one on the back panel and another on the touchscreen of the mobile computing device to perform certain functions. For example, a strong tap on the back panel of the mobile computing device may bring the previously opened application to the foreground. Optionally, the previous application may be visually shown to move forward on the home screen, in an animation, like the task switcher. Then a strong tap on the front may send the current application to the back ground.

FIGS. 31A-32B illustrate some examples of a user's grip being detectable to cause the mobile computing device (e.g., mobile computing device 100 in FIGS. 1A and 1B) to perform a predetermined function, in accordance with various embodiments. Various embodiments detect normal grip holding patterns (when the user is just holding the device) from intentional touch and gestures on the back or side. Specific aspects and variations of various embodiments include:

Detecting a unique grip to trigger the detection mode for back/side touches. For example, user may place the middle and index finger close together, which is not the normal way for holding the device.

Detecting a unique tap or back/side gesture to listen for other back/side gestures. In other words, the device may only (always) be watching for a hard back tap (which is not normally associated with a standard holding grip). Once this is identified, then it can start listening for other kinds of back/side touches.

Utilizing contextual cues to trigger the detection mode for back/side touches. For example, the currently displayed app could provide the trigger. Likewise, the device position could provide the trigger (lying flat on a table could allow back/side touches) or utilize environmental characteristics to trigger the detection mode for back/side touches. For example, if the ambient brightness is very high and different from when the display brightness was last set, then allow a back touch to adjust brightness level.

Detecting combinations of grip and context may trigger functions.

Grip and/or context may also enable different sets of back/side touches to be performed.

Shaking the phone is another way to trigger a mode that allows the user to use back/side touches.

In some embodiments, a particular grip (e.g., one-handed grip), once detected, may change a threshold needed for certain gestures or particular touch inputs through the touch sensors to be recognized or to trigger other functions. This type of feature may allow the user to be less accurate in their inputs of certain touch patterns or gestures. For example, a classifier used by the processor to match received input patterns to stored patterns of recognizable gestures may require a less perfect match while the mobile computing device is being gripped in the one-handed mode as compared to other modes. In addition, this feature may limit accidental false triggering of special actions (such as one-handed mode) by constraining their activation to certain grips or circumstances with which users interact with their mobile communication device.

Figures 31A, 31B:
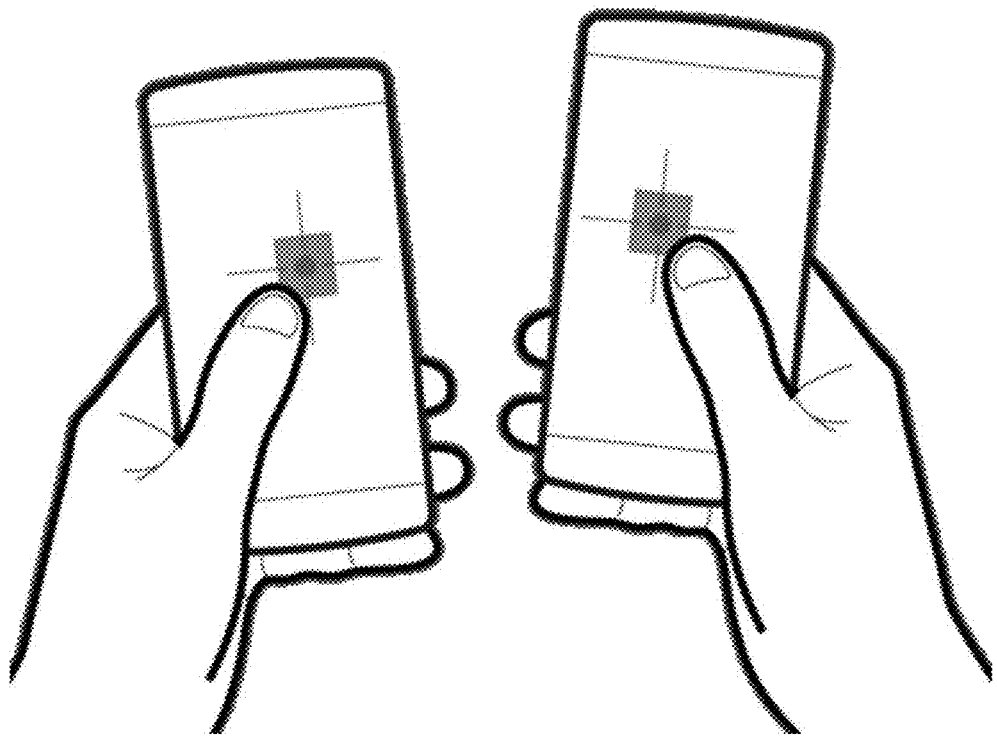
FIGS. 31A and 31B are plan views of a user gripping a mobile computing device, which automatically activates certain features.

FIGS. 31A and 31B illustrates a user gripping a mobile computing device, which automatically activates certain features. The user's grip method may be detected by the touch sensors. Thus, such contextual awareness data may be used to provide an offset between a target location on the touchscreen and the actual location that gets touched. A processor may detect the type of grip and adjust the expected offsets accordingly for improving touchpad accuracy and performance. One-handed right-hand, one-handed left-hand, and two-handed grips may be accommodated in this way.

Figures 32A, 32B:
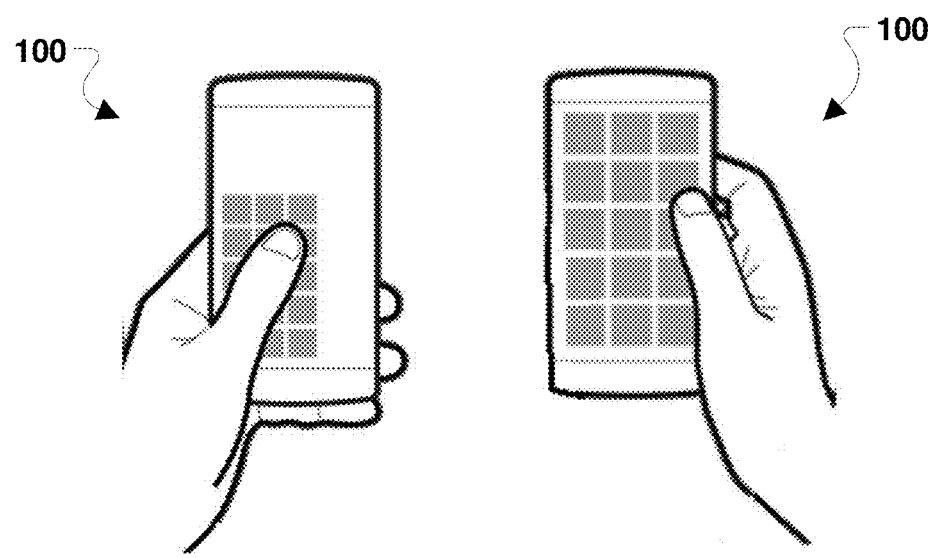
FIGS. 32A and 32B are plan views of a user gripping a mobile computing device in a manner that automatically activates certain features.

FIGS. 32A and 32B illustrates a user gripping a mobile computing device, which automatically activates certain features. A processor of the mobile computing device may categorize a detected grip and then optimize the user interface for the detected grip. For example, the user interface may automatically toggle between a one-handed mode (i.e., FIG. 32A) and a two-handed mode (i.e., FIG. 32B), when the user changes grip. In addition, the user interface may automatically show the one-handed user interface shifted to one side; the side toward the gripping palm. Also, the processor of the mobile computing device may detect the size of the hand and vertical location along the display, to optimize the one-handed user interface. This may allow a user to scroll up with back-touch, and access content that is out reach from the front facing finger/thumb.

Figure 33A:
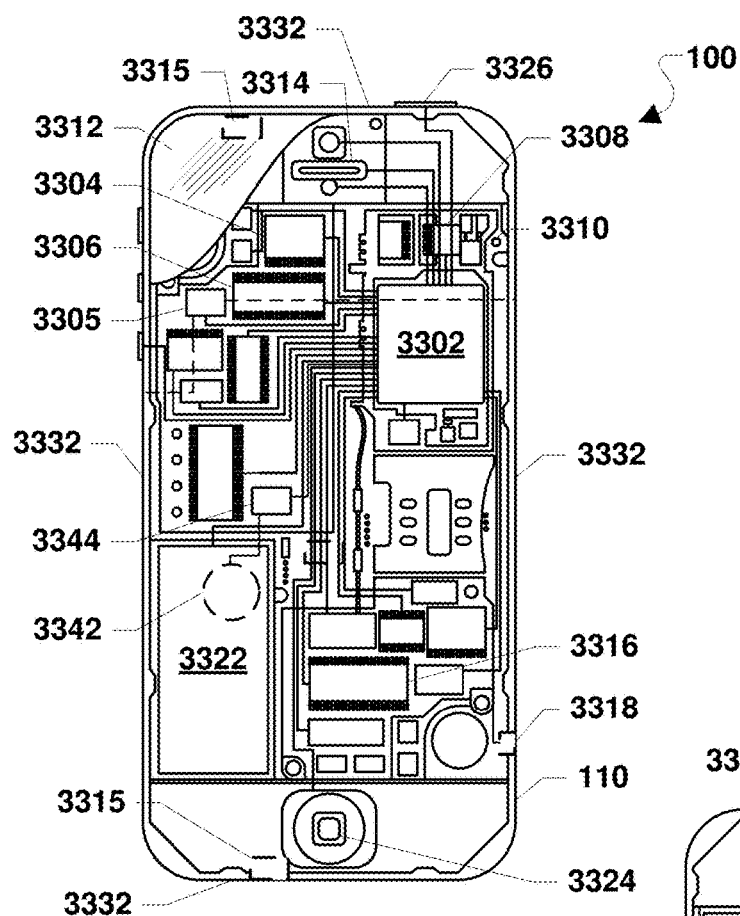
FIGS. 33A and 33B are component diagrams of an example mobile computing device suitable for use with various embodiments.
Figure 33B:
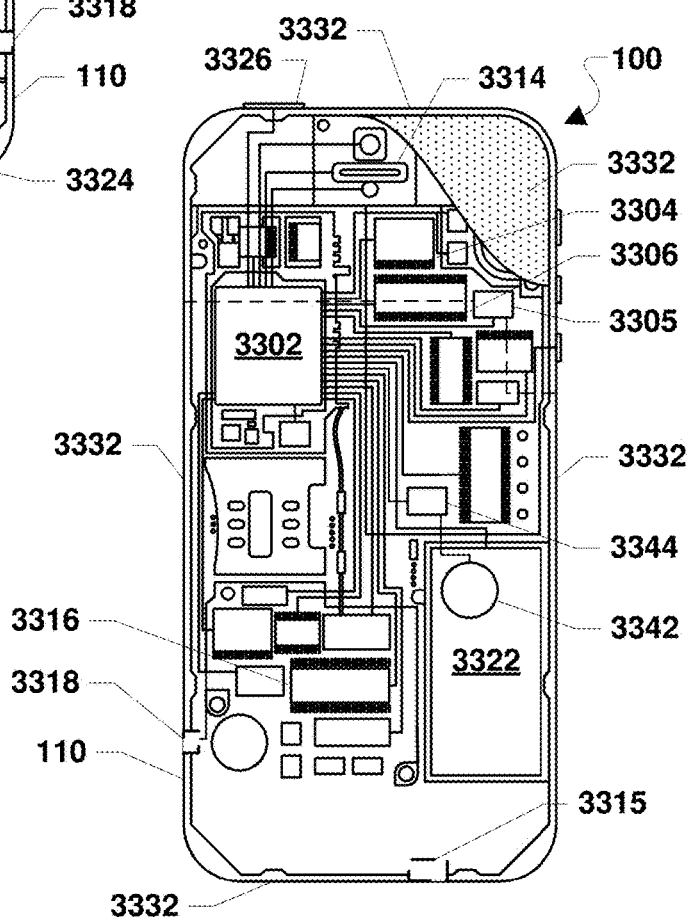

Various embodiments may be implemented one or more of a variety of mobile computing devices, an example of which in the form of a smartphone is illustrated in FIGS. 33A and 33B. With reference to FIGS. 1A-33B, a mobile computing device 100 may include a body 110, constructed of a plastic, metal, ceramic, glass, or a combination of such materials, for containing all or some of various components. The mobile computing device 100 may include a processor 3302 coupled to various systems and components. In particular, the processor 3302 may be coupled to an internal memory 3306, a touchscreen controller 3304, a touch sensor controller 3305, radio communication elements, speakers 3314, and a microphone 3315. The processor 3302 may be a single core or a multi-core processor designated for general or specific processing tasks. The internal memory 3306 may be volatile or non-volatile memory, and may also be secure and/or encrypted memory, or unsecure and/or unencrypted memory, or any combination thereof.

The touchscreen controller 3304 may be coupled to a touchscreen display 3312, such as a resistive-sensing touchscreen, a capacitive-sensing touchscreen, infrared sensing touchscreen, etc. A touchscreen display 3312, which uses touch sensing, may include one or more touch sensors (e.g., 102). The touch sensor controller 3305 and the processor 3302 may be coupled to one or more touch sensors 3332, such as touch sensors (e.g., 102, 104, 106). One or more touch sensors 3332 may be located on the back panel (e.g., rear area 114), sides (e.g., 116a, 116b), top, and/or bottom of the mobile computing device 100.

The mobile computing device 100 may include one or more radio signal transceivers 3308 (e.g., Peanut, Bluetooth, Bluetooth LE, ZigBee, Wi-Fi®, radio frequency (RF) radio, etc.) coupled to antennae 3310 for sending and receiving communications. The one or more radio signal transceivers 3308 may be coupled to each other and/or to the processor 3302. The radio signal transceivers 3308 may implement the various wireless transmission protocol stacks and interfaces. For example, the mobile computing device 100 may include a cellular network wireless modem chip 3316 coupled to the processor that enables communication via a cellular network.

The mobile computing device 100 may include a peripheral device connection interface 3318 coupled to the processor 3302. The peripheral device connection interface 3318 may be configured to accept one or more types of physical and communication connections, common or proprietary, such as USB, FireWire, Thunderbolt, or PCIe. The peripheral device connection interface 3318 may also be coupled to a similarly configured peripheral device connection port (not shown).

The mobile computing device 100 may include a power source 3322 (e.g., a battery) coupled to the processor 3302, such as a disposable or rechargeable battery. The rechargeable battery may also be coupled to the peripheral device connection port to receive a charging current from a source external to the mobile computing device 100. Additionally, or alternatively, the rechargeable battery may be charged through wireless charging, such as through wireless charging antenna 3342. A wireless charging controller 3344 may be coupled to the wireless charging antenna 3342 and the power source 3322 and configured to regulate the charging/recharging of the power source 3322 based on a charge state of the power source 3322, availability of wireless charging as sensed by the wireless charging antenna 3342 and/or control signals received from the processor 3302. The wireless charging controller 3344 may be configured according to various embodiments to disconnect or otherwise control one or more touch sensors 3332 located on the back panel (e.g., 114) to minimize interference with charging and avoid spurious inputs caused by wireless charging.

In various embodiments, the mobile computing device 100 may include one or more microphones 3315. For example, the mobile computing device may have microphones 3315 that are conventional for receiving voice or other audio frequency energy from a user during a call. The mobile computing device 100 may also include speakers 3314 for providing audio outputs. The mobile computing device 100 may also include one or more physical buttons 3324, 3326 for receiving user inputs.

The processors described herein may be any programmable microprocessor, microcomputer or multiple processor chip or chips that can be configured by software instructions (applications) to perform a variety of functions, including the functions of various embodiments described above. In some devices, multiple processors may be provided, such as one processor dedicated to wireless communication functions and one processor dedicated to running other applications. Typically, software applications may be stored in the internal memory before they are accessed and loaded into the processors. The processors may include internal memory sufficient to store the application software instructions. In many devices the internal memory may be a volatile or nonvolatile memory, such as flash memory, or a mixture of both. For the purposes of this description, a general reference to memory refers to memory accessible by the processors, including internal memory or removable memory plugged into the device and memory within the processor, themselves.

Various embodiments illustrated and described are provided merely as examples to illustrate various features of the claims. However, features shown and described with respect to any given embodiment are not necessarily limited to the associated embodiment and may be used or combined with other embodiments that are shown and described. Further, the claims are not intended to be limited by any one example embodiment. For example, one or more of the operations of the methods 300, 400, 500, 600, 700, 800, 900, and 1000 may be substituted for or combined with one or more operations of the methods 300, 400, 500, 600, 700, 800, 900, and 1000 and vice versa.

The foregoing method descriptions and the process flow diagrams are provided merely as illustrative examples and are not intended to require or imply that the operations of various embodiments must be performed in the order presented. As will be appreciated by one of skill in the art the order of operations in the foregoing embodiments may be performed in any order. Words such as "thereafter," "then," "next," etc. are not intended to limit the order of the operations; these words are used to guide the reader through the description of the methods. Further, any reference to claim elements in the singular, for example, using the articles "a," "an," or "the" is not to be construed as limiting the element to the singular.

Various illustrative logical blocks, modules, circuits, and algorithm operations described in connection with the embodiments disclosed herein may be implemented as electronic hardware, computer software, or combinations of both. To clearly illustrate this interchangeability of hardware and software, various illustrative components, blocks, modules, circuits, and operations have been described above generally in terms of their functionality. Whether such functionality is implemented as hardware or software depends upon the particular application and design constraints imposed on the overall system. Skilled artisans may implement the described functionality in varying ways for each particular application, but such embodiment decisions should not be interpreted as causing a departure from the scope of the claims.

The hardware used to implement various illustrative logics, logical blocks, modules, and circuits described in connection with the embodiments disclosed herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some operations or methods may be performed by circuitry that is specific to a given function.

In one or more embodiments, the functions described may be implemented in hardware, software, firmware, or any combination thereof. If implemented in software, the functions may be stored as one or more instructions or code on a non-transitory computer-readable storage medium or non-transitory processor-readable storage medium. The operations of a method or algorithm disclosed herein may be embodied in a processor-executable software module or processor-executable instructions, which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

The preceding description of the disclosed embodiments is provided to enable any person skilled in the art to make or use the claims. Various modifications to these embodiments will be readily apparent to those skilled in the art, and the generic principles defined herein may be applied to other embodiments without departing from the spirit or scope of the claims. Thus, the present disclosure is not intended to be limited to the embodiments shown herein but is to be accorded the widest scope consistent with the following claims and the principles and novel features disclosed herein.

What is claimed is:

1. A method performed by a processing device of a mobile computing device for responding to multisensor inputs, comprising:
  receiving a first input from a first touch sensor on the mobile computing device
  determining a first type of user interaction based on the received first input;
  determining whether the first type of user interaction matches data in a multisensor input data structure;
  receiving a second input from a second touch sensor on the mobile computing device;
  determining whether the second input is received during a multisensor input sequence duration following receiving the first input;
  determining a second type of user interaction based on the received second input;
  determining whether the second type of user interaction matches the data in the multisensor input data structure;
  executing a function associated with a multisensor input in response to determining that:
    the first type of user interaction matches the data in the multisensor input data structure;
    the second type of user interaction matches the data in the multisensor input data structure; and
    the second input is received during the multisensor input sequence duration following receiving the first input; and determining that the first input and the second input are each single sensor inputs in response to determining that the first input and the second input are not each part of a multisensor input.

2. The method of claim 1, wherein the determining whether the second input is received during multisensor input sequence duration following receiving the first input comprises determining that the second input is received during multisensor input sequence duration following receiving the first input in response to the first input and the second input being received at least partially concurrently.

3. The method of claim 1, further comprising
identifying a first quality of a plurality of received inputs comprising the first input;
identifying a second quality of a plurality of received inputs comprising the second input; and
identifying the multisensor input based on the identified first quality of the plurality of received inputs comprising the first input and the second quality of the plurality of received inputs comprising the second input.

4. The method of claim 3, wherein the first quality and the second quality are one or more of: a tap; a strong tap; a quick tap; multiple taps; a location of a tap; a press; a duration of a press; a pressure of a press; a location of a press; a swipe; a single finger swipe; a multiple finger swipe; a speed of a swipe, a length of a swipe, a location of a swipe; a gesture; a shape of the gesture; a hover; a height of a hover; a duration of a hover; a location of a hover; a grip; a handedness of a grip, a number of hands or fingers used for a grip, a location of a grip; a pressure of a grip; an area of a grip; or a part of a body or object used to make the interaction.

5. A mobile computing device, comprising:
a first touch sensor;
a second touch sensor; and
a processing device communicatively connected to the first touch sensor, and the second touch sensor, wherein the processor is configured with processor-executable instructions to:
receive a first input from a first touch sensor on the mobile computing device;
determine a first type of user interaction based on the received first input;
determine whether the first type of user interaction matches data in a multisensor input data structure;
receive a second input from a second touch sensor on the mobile computing device;
determine whether the second input is received during a multisensor input sequence duration following receiving the first input;
determine a second type of user interaction based on the received second input;
determine whether the second type of user interaction matches the data in the multisensor input data structure;
execute a function associated with the identified multisensor input in response to determining that:
the first type of user interaction matches the data in the multisensor input data structure;
the second type of user interaction matches the data in the multisensor input data structure; and
the second input is received during the multisensor input sequence duration following receiving the first input; and
determine that the first input and the second input are each single sensor inputs in response to determining that the first input and the second input are not each part of a multisensor input.

6. The mobile computing device of claim 5, wherein the processing device is configured with processor-executable instructions to determine that the second input is received during multisensor input sequence duration following receiving the first input in response to the first input and the second input being received at least partially concurrently.

7. The mobile computing device of claim 5, wherein the processing device is configured with processor-executable instructions to:
identify a first quality of a plurality of received inputs comprising the first input;
identify a second quality of a plurality of received inputs comprising the second input; and
identify the multisensor input based on the identified first quality of the plurality of received inputs comprising the first input and the second quality of the plurality of received inputs comprising the second input.

8. The mobile computing device of claim 7, wherein the first quality and the second quality are one or more of: a tap; a strong tap; a quick tap; multiple taps; a location of a tap; a press; a duration of a press; a pressure of a press; a location of a press; a swipe; a single finger swipe; a multiple finger swipe; a speed of a swipe, a length of a swipe, a location of a swipe; a gesture; a shape of the gesture; a hover; a height of a hover; a duration of a hover; a location of a hover; a grip; a handedness of a grip, a number of hands or fingers used for a grip, a location of a grip; a pressure of a grip; an area of a grip; or a part of a body or object used to make the interaction.

9. The mobile computing device of claim 8, wherein the first touch sensor and the second touch sensor includes two or more of a touch sensor on one or more of a front area of the mobile device, rear area of the mobile device, a side of the mobile device, a top area of the mobile device or a bottom surface of the mobile device.

10. A mobile computing device, comprising:
means for receiving a first input from a first touch sensor on the mobile computing device;
means for determining a first type of user interaction based on the received first input;
means for determining whether the first type of user interaction matches data in a multisensor input data structure;
means for receiving a second input from a second touch sensor on the mobile computing device;
means for determining whether the second input is received during a multisensor input sequence duration following receiving the first input;
means for determining a second type of user interaction based on the received second input;
means for determining whether the second type of user interaction matches the data in the multisensor input data structure;
means for executing a function associated with the identified multisensor input in response to determining that:
the first type of user interaction matches the data in the multisensor input data structure;
the second type of user interaction matches the data in the multisensor input data structure; and
the second input is received during the multisensor input sequence duration following receiving the first input; and
means for determining that the first input and the second input are each single sensor inputs in response to determining that the first input and the second input are not each part of a multisensor input.

11. The mobile computing device of claim 10, wherein means for determining whether the second input is received during multisensor input sequence duration following receiving the first input comprises means for determining that the second input is received during multisensor input sequence duration following receiving the first input in response to the first input and the second input being received at least partially concurrently.

12. The mobile computing device of claim 10, further comprising
   means for identifying a first quality of a plurality of received inputs comprising the first input;
   means for identifying a second quality of a plurality of received inputs comprising the second input; and
   means for identifying the multisensor input based on the identified first quality of the plurality of received inputs comprising the first input and the second quality of the plurality of received inputs comprising the second input.

13. The mobile computing device of claim 12, wherein the first quality and the second quality are one or more of: a tap; a strong tap; a quick tap; multiple taps; a location of a tap; a press; a duration of a press; a pressure of a press; a location of a press; a swipe; a single finger swipe; a multiple finger swipe; a speed of a swipe, a length of a swipe, a location of a swipe; a gesture; a shape of the gesture; a hover; a height of a hover; a duration of a hover; a location of a hover; a grip; a handedness of a grip, a number of hands or fingers used for a grip, a location of a grip; a pressure of a grip; an area of a grip; or a part of a body or object used to make the interaction.

14. The mobile computing device of claim 12, wherein the first touch sensor and the second touch sensor includes two or more of a touch sensor on one or more of a front area of the mobile device, rear area of the mobile device, a side of the mobile device, a top area of the mobile device or a bottom surface of the mobile device.

15. A non-transitory processor-readable storage medium, wherein processing of a first input from a first touch sensor is enabled, and having stored thereon processor-executable instructions configured to cause a processor of a computing device to perform operations comprising:
   receiving a first input from a first touch sensor on the mobile computing device;
   determining a first type of user interaction based on the received first input;
   determining whether the first type of user interaction matches data in a multisensor input data structure;
   receiving a second input from a second touch sensor on the mobile computing device;
   determining whether the second input is received during a multisensor input sequence duration following receiving the first input;
   determining a second type of user interaction based on the received second input;
   determining whether the second type of user interaction matches the data in the multisensor input data structure;
   executing a function associated with a multisensor input in response to determining that:
      the first type of user interaction matches the data in the multisensor input data structure;
      the second type of user interaction matches the data in the multisensor input data structure; and
      the second input is received during the multisensor input sequence duration following receiving the first input; and
   determining that the first input and the second input are each single sensor inputs in response to determining that the first input and the second input are not each part of a multisensor input.

16. The non-transitory processor-readable storage medium of claim 15, wherein the stored processor executable instructions are configured to perform operations such that determining whether the second input is received during multisensor input sequence duration following receiving the first input comprises determining that the second input is received during multisensor input sequence duration following receiving the first input in response to the first input and the second input being received at least partially concurrently.

17. The non-transitory processor-readable storage medium of claim 15, wherein the stored processor executable instructions are configured to perform operations further comprising
   identifying a first quality of a plurality of received inputs comprising the first input;
   identifying a second quality of a plurality of received inputs comprising the second input; and
   identifying the multisensor input based on the identified first quality of the plurality of received inputs comprising the first input and the second quality of the plurality of received inputs comprising the second input.

18. The non-transitory processor-readable storage medium of claim 17, wherein the stored processor executable instructions are configured to perform operations such that the first quality and the second quality are one or more of: a tap; a strong tap; a quick tap; multiple taps; a location of a tap; a press; a duration of a press; a pressure of a press; a location of a press; a swipe; a single finger swipe; a multiple finger swipe; a speed of a swipe, a length of a swipe, a location of a swipe; a gesture; a shape of the gesture; a hover; a height of a hover; a duration of a hover; a location of a hover; a grip; a handedness of a grip, a number of hands or fingers used for a grip, a location of a grip; a pressure of a grip; an area of a grip; or a part of a body or object used to make the interaction.

* * * * *